(12) United States Patent
Tomioka et al.

(10) Patent No.: US 7,605,730 B2
(45) Date of Patent: Oct. 20, 2009

(54) ANALOG-DIGITAL CONVERTING APPARATUS AND RADIO COMMUNICATION TERMINAL

(75) Inventors: Tazuko Tomioka, Kawasaki (JP); Ren Sakata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/043,198

(22) Filed: Mar. 6, 2008

(65) Prior Publication Data

US 2008/0218395 A1 Sep. 11, 2008

(30) Foreign Application Priority Data

Mar. 9, 2007 (JP) ............... P2007-060578

(51) Int. Cl.
*H03M 1/00* (2006.01)
(52) U.S. Cl. ............ 341/132; 341/139; 341/143; 341/155
(58) Field of Classification Search ........ 341/132, 341/139, 143, 155
See application file for complete search history.

(56) References Cited

U.S. PATENT DOCUMENTS

| | | | | |
|---|---|---|---|---|
| 5,510,743 A | * | 4/1996 | Shi | 327/165 |
| 5,606,550 A | * | 2/1997 | Jangi | 370/289 |
| 6,445,320 B1 | * | 9/2002 | Noro et al. | 341/139 |
| 6,606,047 B1 | * | 8/2003 | Borjesson et al. | 341/155 |
| 6,836,229 B2 | * | 12/2004 | Gregoire | 341/139 |
| 7,295,073 B2 | * | 11/2007 | Hsieh et al. | 330/279 |
| 7,433,481 B2 | * | 10/2008 | Armstrong et al. | 381/312 |
| 7,472,152 B1 | * | 12/2008 | Tsui et al. | 708/403 |
| 2002/0191705 A1 | * | 12/2002 | Melsa et al. | 375/295 |
| 2003/0012391 A1 | * | 1/2003 | Armstrong et al. | 381/312 |
| 2003/0112887 A1 | * | 6/2003 | Sang et al. | 375/285 |
| 2007/0042733 A1 | | 2/2007 | Tomioka | |
| 2008/0069275 A1 | | 3/2008 | Horiguchi et al. | |

FOREIGN PATENT DOCUMENTS

JP 2004-128923 4/2004

OTHER PUBLICATIONS

Li, et al., "Effects of Clipping and Filtering on the Performance of OFDM", IEEE Vehicular Technology Conference, pp. 1634-1638, (1997).

Mestdagh, et al., "A Method to Reduce the Probability of Clipping in DMT-Based Tranceivers", IEEE Transactions on Communications, vol. 44, No. 10, pp. 1234-1238, (Oct. 1996).

\* cited by examiner

*Primary Examiner*—Linh V Nguyen
(74) *Attorney, Agent, or Firm*—Kimble Intellectual Property Law, PLLC

(57) ABSTRACT

An analog-digital converting apparatus includes: an analog-digital converting unit that performs a conversion from an analog input signal into a digital output signal; a buffer unit that temporary stores the digital output signal for a plurality of samples and outputs the samples in time-series; a clipping detecting unit that detects a first sample having a signal value corresponding to a clipping level of the analog-digital converting unit from among the samples of the digital output signal; and an interpolating unit that rewrites the signal value of the first sample stored in the buffer unit into an estimated signal value that is obtained by estimating a signal value at a time corresponding to a time of the first sample by an interpolation using at least one of (1) a set of second and third samples that are samples previous to the first sample and (2) a set of fourth and fifth samples that are samples subsequent to the first sample.

13 Claims, 17 Drawing Sheets

ANALOG-DIGITAL CONVERTING APPARATUS AND RADIO COMMUNICATION TERMINAL

RELATED APPLICATION(S)

The present disclosure relates to the subject matter contained in Japanese Patent Application No. 2007-060578 filed on Mar. 9, 2007, which is incorporated herein by reference in its entirety.

FIELD

The present invention relates to a technique for suppressing spurious noise caused by the clipping of an A/D converter.

BACKGROUND

By the development of an information society, a communication capacity has been increased remarkably. In many examples, a band which has not been used yet is utilized for a transmitting medium in order to increase the communication capacity. In radio communication, although a specific band is basically utilized with a limitation to specific uses as provided by law, some bands are opened to a plurality of uses. For UWB (Ultra Wide Band) system, a very broad band can be used with a limitation of a low power short distance communication and is opened to overlap with other uses. In this case, there is a possibility that one of radios might be an interference wave with the other radio. For this reason, an interference avoiding technique referred to as DAA (Detect And Avoid) has been obliged to the UWB at a part of frequencies. More specifically, in the case in which a UWB terminal performs a communication at a certain frequency, a radio wave must stop transmission at the frequency upon receipt of the radio wave of a system having a preferential transmission right at the frequency.

With an enlargement of a concept of the DAA, there is reached a radio system in which a radio wave is generated at a frequency when it is confirmed that the frequency is not utilized, and a communication is stopped when a system having a priority starts a transmission at the frequency. This is referred to as a cognitive radio. In the cognitive radio, the system utilizes frequencies excluding the frequency which is being utilized by a system having the priority. Therefore, the frequencies which can be utilized are brought into a moth-eaten state. A range which can be contiguously utilized is varied depending on the frequency.

In order to maintain a necessary bit rate for a high speed communication, it is necessary to utilize a wide frequency range in total to some degree. For this reason, the frequency in the moth-eaten state composed of many bands is to be utilized allowing discontinuity. In this case, there is a higher possibility that a method of digitally synthesizing, separating, modulating and demodulating the bands by using one analog processing unit and A/D (analog-digital) and D/A (digital-analog) converters might be taken in place of modulating and demodulating those bands with different systems, respectively.

When a certain frequency is being utilized, it is necessary to periodically confirm that a terminal of a system having a priority have not started a transmission at the frequency. It is hard to perform the confirmation while performing a communication at the frequency. For this reason, the utilization of the frequency is often stopped properly to detect other radio waves through the execution of carrier sensing in a state in which the cognitive system is not generating the radio wave.

At this time, it is also necessary to detect a radio wave having a power which is as low as possible in order to avoid a hidden terminal problem (a problem in the case in which a transmission is performed on the assumption that other systems are distant because transmitters of the other systems are disposed distantly, and receivers of the other systems are near to a cognitive terminal and cause a interference) as far as possible.

In the case in which the discontiguous frequency bands are received in a lump at the same time as described above, transmitted radio waves from other systems are interposed between the bands utilized by the cognitive terminal. Even if the transmission of the cognitive system is stopped to detect other systems' transmission, the radio waves of other systems interposed between the bands are being continuously transmitted. A cognitive terminal does not want to confirm the contents of the radio waves of the other systems which are continuously transmitted but the fact that the frequency which is being utilized by the cognitive terminal interposed therebetween is used by only a cognitive system and is empty. In the case in which broad bands are received in a lump at the same time, the radio waves transmitted by the other systems are also received together until an A/D conversion and filtering in a digital circuit are performed. In order to perform the carrier sensing to confirm that the other systems do not transmit the radio waves at that time, it is necessary to detect any small signal which is near to a threshold. In some cases in which a large number of other systems utilize frequency bands interposed between the bands utilized by the cognitive terminal. In other cases, a system originally having high PAPR (Peak-to-Average Power Ratio) and a high receiving power is included. In these cases, a very high peak is suddenly generated even if a total average power of the systems is not very high.

When a high PAPR signal is generated, a clipping is caused in an A/D converter if a signal is not suppressed before the A/D converter in order to prevent the A/D converter from being saturated. When the clipping is caused, a large amount of spurious noise (a noise component) referred to as a clipping noise is generated. In many cases, the clipping generates the spurious noise almost uniformly over frequencies. The amount of the spurious noise depends on amplitude and number of times which are subjected to the clipping and a period subjected to the clipping at a time. In many cases in which the signal is received in such a large dynamic range that a thermal noise can be observed, the amount of the spurious noise exceeds the thermal noise. In these cases, even if there are the radio waves of the other systems which have a near level to the thermal noise, there is a possibility that they might be buried in the spurious noise due to the clipping and cannot be detected.

As a simple method of preventing the spurious noise by the clipping, a large margin for an input of the A/D converter is taken to cause a sudden peak to enter a range of an A/D conversion even if the peak is generated. In the method, however, a quantization noise is relatively increased. Depending on the amount of the margin, it is also impossible to detect a small signal if the quantization noise is larger than the thermal noise. It is preferable to increase the number of bits of the A/D converter in order to reduce the quantization noise. However, the A/D converter is generally a component having larger power consumption in receivers. In particular, the number of quantization bits greatly influences the consumed power. In respect of a terminal design, accordingly, it is not preferable that the number of the quantization bits should be increased for a peak which is sometimes generated suddenly.

The generation of the spurious noise due to the clipping is often a problem in a D/A converter of a transmitter. For example, there has been known a problem in that the same situation is generated when a digital signal having a sudden peak is to be converted into an analog signal, and a signal output from a transmitter contains a large amount of unnecessary radiation due to the clipping noise. For example, see JP-A-2004-128923.

In the Background section of the document JP-A-2004-128923, a method of previously clipping a signal on a level corresponding to a clipping level of a D/A converter before a D/A conversion, filtering spurious noise which is generated by the pre-clipping and performing the D/A conversion has been described as a technique for preventing the generated spurious noise. The method has a problem in that a peak which should have been clipped is reproduced by the filtering.

The document JP-A-2004-128923 disclosures a technique in which a waveform is smoothed by using a moving average in place of the pre-clipping, a signal exceeding the clipping level is caused to have a gain on a logarithmic amplifier basis, and the peak is suppressed, and at the same time, an extreme clipping is eliminated. Referring to a method of thus taking a countermeasure against the spurious noise in a digital circuit, it is premised that a signal before clipping has been known to the digital circuit.

The digital circuit cannot know a signal before the A/D conversion. Accordingly, a method of suppressing the generation of the spurious noise by the D/A converter which needs information about a signal before clipping cannot be simply applied to the A/D converter.

In the method of clipping and filtering, a signal having a low power is also removed by filtering at the same time. Therefore, the method is unsuitable for the DAA which is required to detect signals transmitted by the other systems in a frequency in which the spurious noise is generated.

SUMMARY

According to a first aspect of the invention, there is provided an analog-digital converting apparatus including: an analog-digital converting unit that performs a conversion from an analog input signal into a digital output signal; a buffer unit that temporary stores the digital output signal for a plurality of samples and outputs the samples in time-series; a clipping detecting unit that detects a first sample having a signal value corresponding to a clipping level of the analog-digital converting unit from among the samples of the digital output signal; and an interpolating unit that rewrites the signal value of the first sample stored in the buffer unit into an estimated signal value that is obtained by estimating a signal value at a time corresponding to a time of the first sample by an interpolation using at least one of (1) a set of second and third samples that are samples previous to the first sample and (2) a set of fourth and fifth samples that are samples subsequent to the first sample.

According to a second aspect of the invention, there is provided a radio communication terminal including: a RF unit that down-converts a radio wave into an analog input signal; an analog-digital converting unit that converts the analog input signal into a digital output signal; a buffer unit that temporary stores the digital output signal for a plurality of samples and outputs the samples in time-series; a clipping detecting unit that detects a first sample having a signal value corresponding to a clipping level of the analog-digital converting unit from among the samples of the digital output signal; an interpolating unit that rewrites the signal value of the first sample stored in the buffer unit into an estimated signal value that is obtained by estimating a signal value at a time corresponding to a time of the first sample by an interpolation using at least one of (1) a set of second and third samples that are samples previous to the first sample and (2) a set of fourth and fifth samples that are samples subsequent to the first sample; a carrier sensing unit that analyzes the signal level rewritten by the interpolating unit; and a data transmitting unit that stops data transmission in a frequency band when another signal is detected in the frequency band due to the analysis by the carrier sensing unit and performs data transmission in the frequency band when no other signal is detected in the frequency band.

According to a third aspect of the invention, there is provided a computer readable storage medium that stores a program product for causing a computer, which controls an analog-digital converting apparatus having: an analog-digital converting unit that converts an analog input signal into a digital output signal; and a buffer unit that temporary stores the digital output signal for a plurality of samples and outputs the samples in time-series, to perform a process including: detecting a first sample having a signal value corresponding to a clipping level of the analog-digital converting unit from among the samples of the digital output signal; and rewriting the signal value of the first sample stored in the buffer unit into an estimated signal value that is obtained by estimating a signal value at a time corresponding to a time of the first sample by an interpolation using at least one of (1) a set of second and third samples that are samples previous to the first sample and (2) a set of fourth and fifth samples that are samples subsequent to the first sample.

DETAILED DESCRIPTION OF THE EMBODIMENTS

Referring now to the accompanying drawings, embodiments of the present invention will be described in detail.

1. Summary of A/D Converting System

Figure 1:
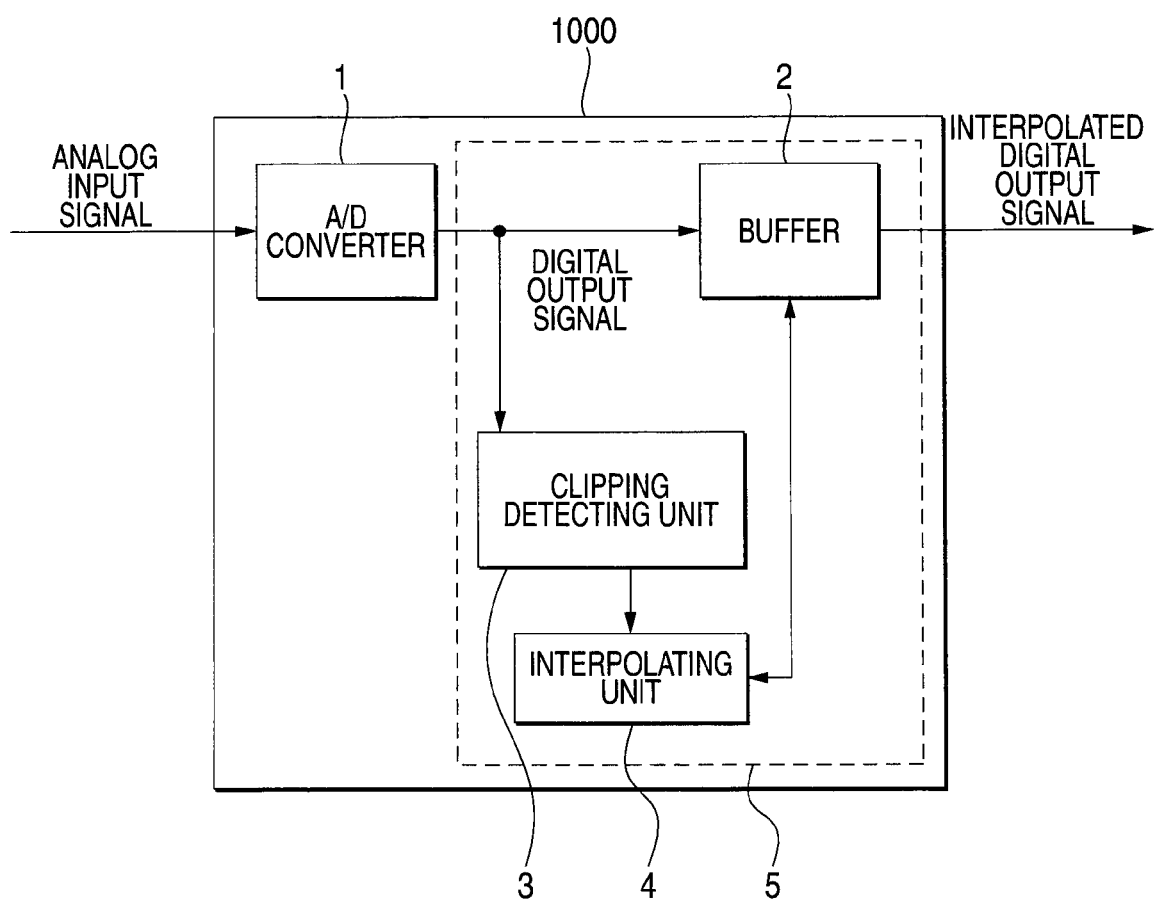
FIG. 1 is a block diagram showing an A/D converting system.

FIG. 1 is a block diagram showing an A/D converting system 1000 according to an embodiment of the invention.

The A/D converging system 1000 includes an A/D converter 1 and an interpolation process section 5. The interpolation process section 5 includes a buffer 2, a clipping detecting unit 3 and an interpolating unit 4.

The A/D converter 1 converts an analog input signal into a digital output signal and outputs the digital output signal. In this embodiment, the A/D converter 1 performs oversampling which is at least a twice of a signal bandwidth of the analog input signal. The digital output signal is output to the interpolation process section 5.

In the interpolation process section 5, the digital output signal which is input is supplied to the buffer 2 and the clipping detecting unit 3.

The buffer 2 serves to store a sample of a digital output signal in an amount corresponding to the process and the processing delay required in the interpolating unit 4. The buffer 2 has a function of a so-called FIFO (First-In-First-Out) buffer and it also has a register function for writing a sample in the middle to/from the interpolating unit 4. A sample group subjected to an interpolation processing by the interpolating unit 4 becomes an interpolated digital output signal to be an output of the A/D converting system 1000. For the amount of samples which can be held by the buffer 2, a new sample input from the A/D converter 1 can be held during the processing executed by the interpolating unit 4 in addition to the number of samples required for a method employed by the interpolating unit 4. As a matter of course, the A/D converter 1 is a real time processing. In the case in which the real time processing is also performed in a subsequent stage of the interpolation process section 5, the buffer 2 always gives a delay corresponding to the number of the samples which can be held irrespective of the presence of a clipping.

The clipping detecting unit 3 detects whether the digital output signal output from the A/D converter 1 has been clipped or not. More specifically, upper and lower clipping level values are held. The digital output signal is compared with the clipping level value. If the results are coincident with each other, it is decided that the clipping is generated.

When the clipping detecting unit 3 detects the generation of the clipping, a notice is given to the interpolating unit 4. Upon receipt of the notice, the interpolating unit 4 takes, from the buffer 2, a sample having the clipping level and a number of sample values which is determined by an algorithm corresponding to an interpolation function to be used before and after the sample. The interpolating unit 4 estimates a sample value before clipping in accordance with an interpolation algorithm by using the samples thus taken. Then, the interpolating unit 4 returns the estimated value thus obtained to a position in the buffer 2 which the sample having the clipping level (that is, overwrite is performed) As a result, the estimated value becomes a value of the sample.

Referring to the sample having the clipping level, thus, the value of the sample is replaced with the estimated value before the clipping. Even if the number of the quantization bits is not increased, consequently, it is possible to reduce the amount of the spurious noise without sacrificing signal amplitude. Moreover, it is not necessary to estimate a sample having no clipping level and to perform fetch and overwrite process of the sample, and therefore, it is possible to avoid the waste of an operating power in the case in which there is no clipping.

2. Interpolating Method of A/D Converting System

An example of the interpolation processing in the interpolation process section 5 (particularly, the interpolating unit 4) will be described below.

Description will be given to the example in which there are used roughly two types of interpolations, that is, an interpolation using a polynomial function and an interpolation using an SINC function, and a large advantage can be obtained by properly using them according to circumstances and utilizing them in combination. However, the present invention is not limited to the following example.

2-1. Interpolation Using Polynomial Function

In the following, description will be given to the interpolation using the polynomial function.

The interpolation using the polynomial is a method of applying a polynomial of $y=A_m x^m + A_{m-a} x^{m-1} + \ldots + A_0$ to a plurality of points in which "x" and "y" are known and obtaining coefficients of $A_m, A_{m-1}, \ldots, A_0$ to determine a curve, and then calculating a value corresponding to unknown "x".

"m" is an order and the interpolation is referred to as a third-order polynomial interpolation when "m" is 3. Moreover, the case in which "m" is 1 is included in the polynomial interpolation in a wide sense. Only this case is sometimes referred to as a linear interpolation. Referring to the polynomial interpolation, a coefficient is simply obtained from (m+1) points. There is also a method of obtaining the coefficient from more points in order for a derivative to be coincident if the order is increased.

For the interpolation using the polynomial function, the number of sample points before and after the clipped samples required for interpolation is small, and furthermore, a calculation is simple. Therefore, it is possible to reduce a time required for the calculation and an amount of the calculation. Accordingly, a processing is small and a size of the buffer 2 can also be reduced. Therefore, it is also possible to reduce a delay in the buffer 2.

2-1-1. Twice Oversampling and Linear Interpolation of Consecutive Clipped Point

Figure 2:
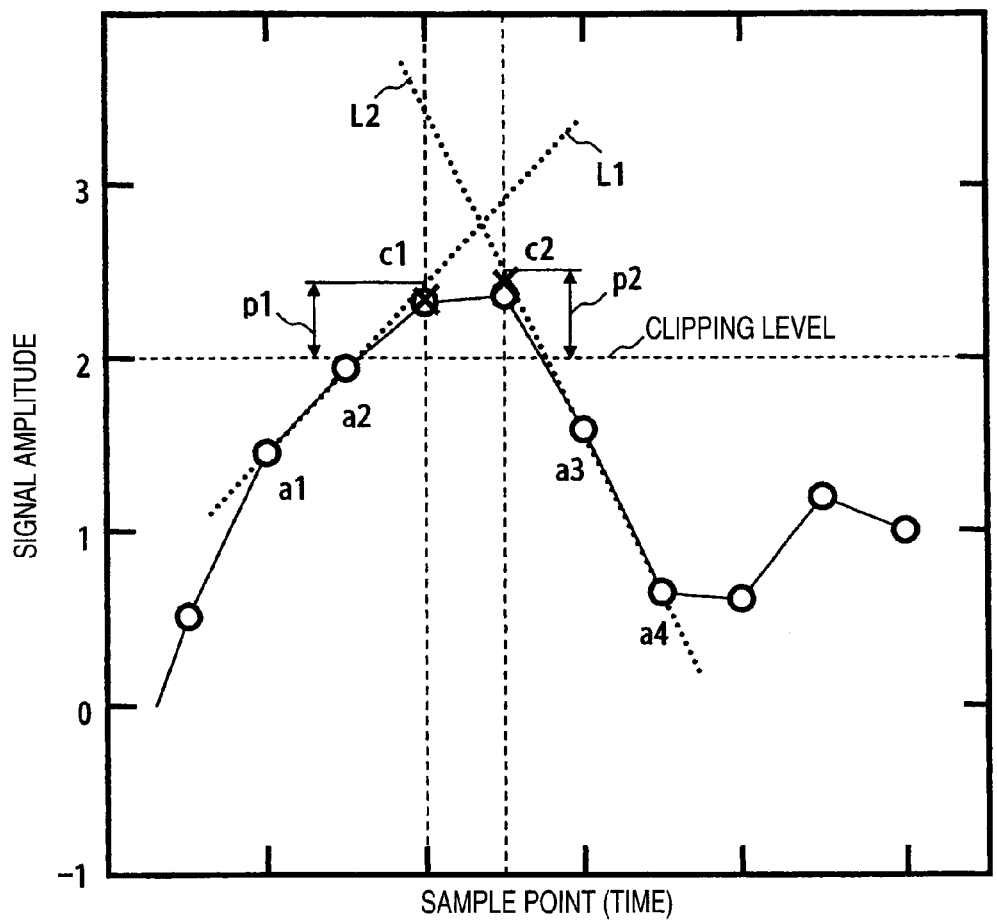
FIG. 2 is a chart showing a waveform (a sample group) of a digital output signal in the case in which twice oversampling is performed.
Figure 4:
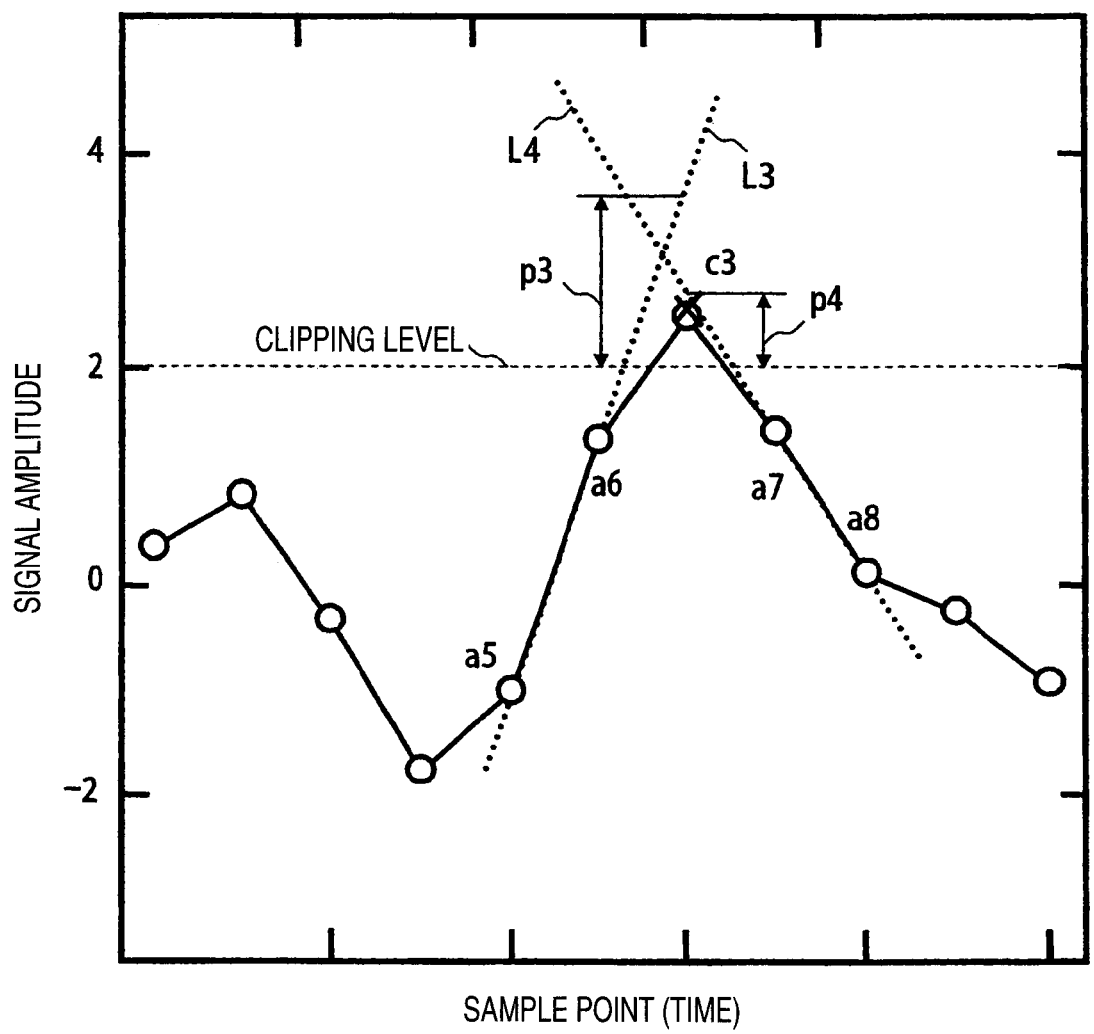
FIG. 4 is a chart showing a waveform (a sample group) of a digital output signal in the case in which the twice oversampling is performed.

An order of a polynomial may be slightly varied depending on times of oversampling. FIGS. 2 and 4 are charts for explaining a waveform (a sample group) of a digital output signal in the case in which the A/D converter 1 performs twice oversampling and an operation of the A/D converting system 1000 according to the embodiment.

It is preferable to use the linear interpolation in the case of the twice oversampling. The waveforms shown in FIGS. 2 and 4 are a part of an OFDM symbol waveform for a 128 subcarrier QPSK modulation. The horizontal axis indicates time (sample point) and the vertical axis indicates signal amplitude. A sample value shown in white dots is a value corresponding to an analog input signal before A/D conversion by the A/D converter 1. Moreover, a waveform shown in a solid narrow line is a line connecting the values of the analog input signal. A horizontal broken line with amplitude=2 indicates the clipping level. When the clipping level is exceeded, a digital output signal of the A/D converter 1 has a value corresponding to 2. Waveforms shown in FIGS. 2 and 4 have large PAPR and sometimes exceed the clipping level. Accordingly, points shown in c1 and c2 of FIG. 2 have a value of the clipping level of 2 as the digital output signal of the A/D converter 1.

The clipping detecting unit 3 detects the clipping and gives the interpolating unit 4 a notice indicative of the clipped sample which is detected. Upon receipt of the notice, the interpolating unit 4 takes samples corresponding to c1 and c2 and samples of from a1 to a4 therebefore and thereafter (a sample subjected to the clipping and two points before and after the sample).

When detecting digital output signals having the clipping level continuously like c1 and c2, the clipping detecting unit 3 further detects that they make a sample group in which they are subjected to the clipping in a lump. More specifically, in the case in which a plurality of samples is continuously subjected to the clipping, they are regarded to be a group if signs of amplitude values thereof are identical to each other. Consequently, a notice indicative of a starting time and the number of samples is given to the interpolating unit 4.

Since the linear interpolation has a first polynomial order, a straight line is determined from two samples. In the case of FIG. 2, a straight line L1 is determined from two points a1 and a2 before the sample subjected to the clipping. A value corresponding to a time of a point c1 subjected to the clipping is calculated from the straight line L1. In FIG. 2, a value is obtained by adding a portion indicated as p1 to the clipping level. Similarly, a straight line L2 is obtained from points a3 and a4 behind the sample subjected to the clipping and p2 corresponding to c2 is thus obtained.

This is a simple linear interpolation. Actually, a numeric value of the linear interpolation is excessively large in many cases. In those cases, the calculated value may be multiplied by a certain correction factor to reduce the numeric value. More specifically, an excess portion over the clipping level is reduced by multiplying the amounts of p1 and p2 in FIG. 2 by a certain correction factor. Points thus obtained are shown in a mark of X in the drawing.

Figure 3:
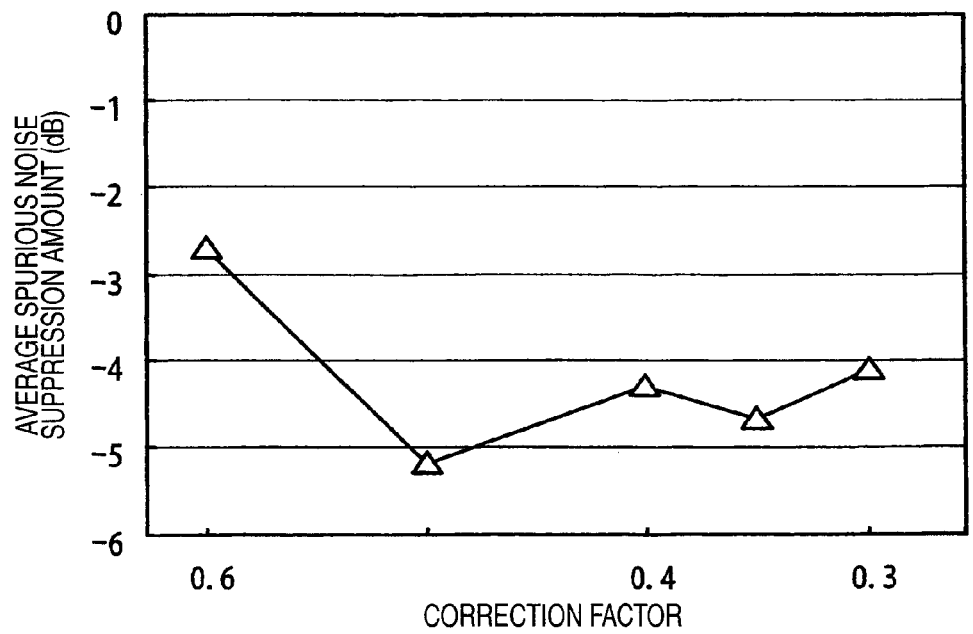
FIG. 3 is a chart showing a result of a simulation in an algorithm for multiplying a correction factor.

FIG. 3 shows an example of a result of a simulation in the algorithm in which the correction factor is multiplied. The result indicates decrease in an amount of spurious noise appearing on a digital output signal with respect to that just after clipping. In the simulation, an OFDM signal of 128 subcarrier QPSK is generated and an amplitude is adjusted to exceed the clipping level, and the correction factor is varied by the algorithm.

The result is obtained by taking an average corresponding to approximately 20 OFDM symbols. It can be read that the amount of suppression of the spurious noise is decreased most greatly in factors of 0.5 to 0.4. It can be supposed that such a value is desirable for the correction factor.

2-1-2. Twice Oversampling and Linear Interpolation of Single Clipped Point

In the example of FIG. 2, the two points of c1 and c2 exceed the clipping level in a lump, and c1 to be the front point is obtained by performing a linear interpolation with the two points a1 and a2 therebefore and c2 to be the rear point is obtained by performing the linear interpolation with the two points a3 and a4 thereafter. In a twice oversampling, however, the signal is changed comparatively suddenly every sample so that the clipping tends to occur with only one point. Also in this case, similarly, it is sufficient that the linear interpolation is performed on the two front points or the two rear points. An example of a coping method which can be supposed to be further effective will be described with reference to FIG. 4.

In the same manner as in the case of FIG. 2, two points in each of forward and rearward portions of a clipped point c3, that is, from a5 to a8 are taken. Next, straight lines L3 and L4 are obtained from the two front points and the two rear points in the same manner. Values corresponding to c3 which exceed the clipping level are calculated from the two lines, respectively. In FIG. 4, they are indicated as clipping level +p3 and +p4, respectively. In order to obtain an interpolated value for only one point of c3, an average value of p3 and p4 is calculated, the average value is multiplied by a certain correction factor in the same manner as in the case of two points and a portion exceeding the clipping level is compressed, and a value thus obtained is determined as an excess part over the clipping level. The value thus determined is a point shown as X.

In the twice oversampling, a change in a signal, that is, a change in a sign of a derivative of the signal occurs comparatively quickly. For this reason, the clipping is rarely performed with three or more points in a lump. In most cases, accordingly, it is sufficient that one or two consecutive clipped points can be interpolated and corrected. If it is necessary to interpolate the consecutive clipped samples of three or more points, it is preferable to change a polynomial to have a second or third order or to perform a further linear interpolation using the obtained value on both ends and multiply it by another smaller factor.

In the examples of FIGS. 2 and 4, for simplicity of the explanation, a portion in which a time variation in the signal is comparatively gentle is cut out. In the twice oversampling, generally, there is generated a very rapid change in which a sign of a derivative is varied on a two-point unit in the case of a quick change. However, the rapid change cannot be reproduced with a polynomial of order of two or more due to a limitation of a slowness of waveform variation which is determined by the polynomial order itself. Consequently, an estimated value might be very different from a value before the clipping. As a matter of course, if the order is increased very greatly, a sufficiently sharp peak can be expressed. In that case, however, it is necessary to take a distant point on a time basis which is rarely related to a clipped point. Furthermore, a size of a matrix to be used in an inverse matrix calculation for obtaining a coefficient is increased. Therefore, an amount of the calculation is increased dramatically. In the twice oversampling, accordingly, the amount of the calculation can be reduced and an originally sharp change can be reproduced more easily by using a simple calculation, for example, decreasing the order to the linear interpolation and multiplying a constant.

Figure 5:
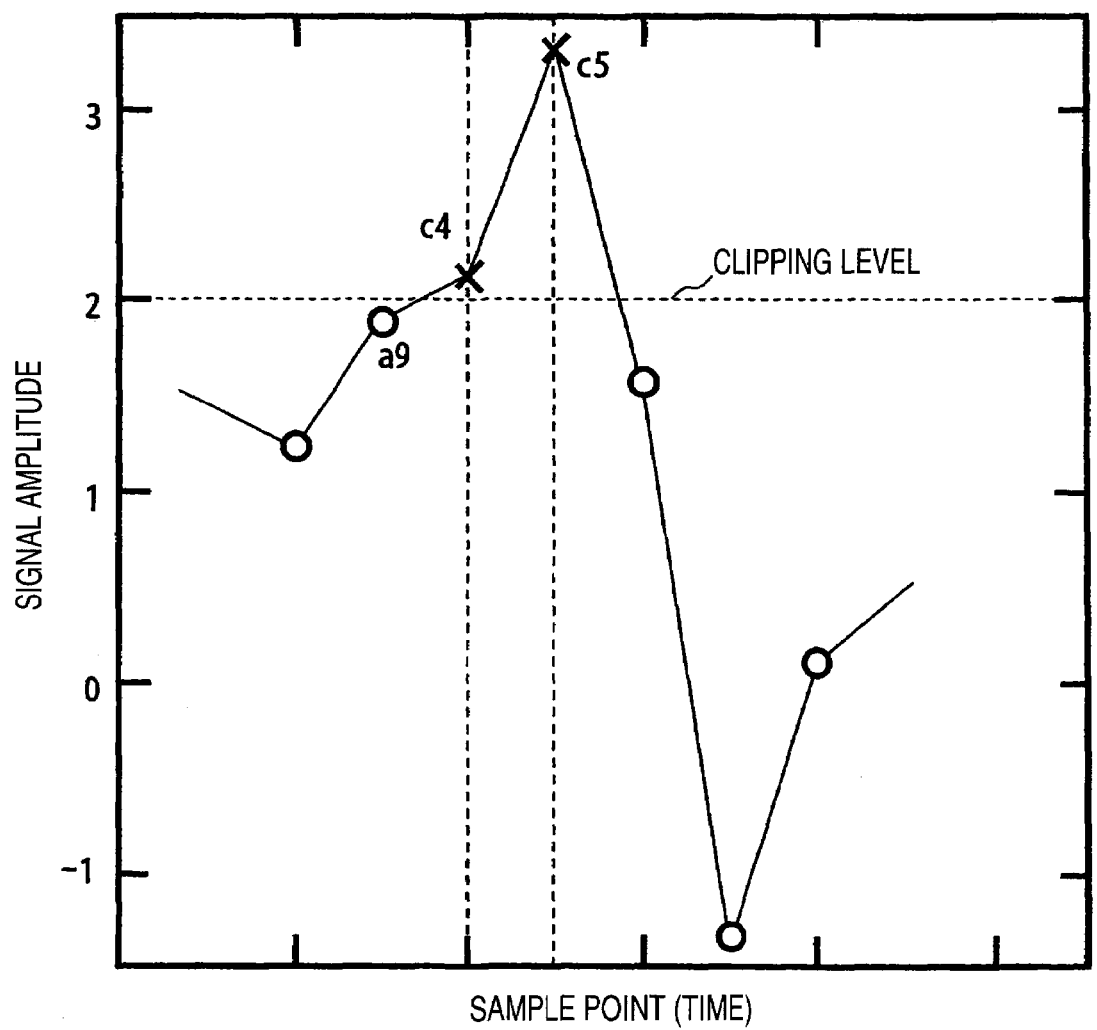
FIG. 5 is a chart showing an example in which relative slopes of a straight line connecting a sample obtained after an interpolation and a line used in a linear interpolation are large.

2-1-3. Correction of Abnormal Value in Linear Interpolation in Twice Oversampling In some cases in which the linear interpolation is used in the twice oversampling and the number of continuously collective clipped points is two, absolute values of respective slopes of a straight line obtained from two not-clipped points before the clipped point and a straight line obtained by two not-clipped points behind the clipped point are considerably different from each other. For example, in FIG. 5, a line connecting a sample a9 and interpolated samples c4 and c5 has a difference in slopes which cannot be made in the twice oversampling Depending on values of the points before and after the clipped points, these phenomena sometimes happen. The difference in an slope will be hereinafter referred to as a bend. In FIG. 5, a derivative which is once decreased from the non-clipped point a9 to the subsequent clipped point c4 is increased toward c5. As a result, the point of c5 has a very sharp peak. Such a waveform has large spurious noise components on the outside of the original signal band and deteriorates a spurious noise suppressing performance through an interpolation.

Description will be given to a technique for a waveform to have a suitable smoothness corresponding to the oversampling times in this case.

Figure 6:
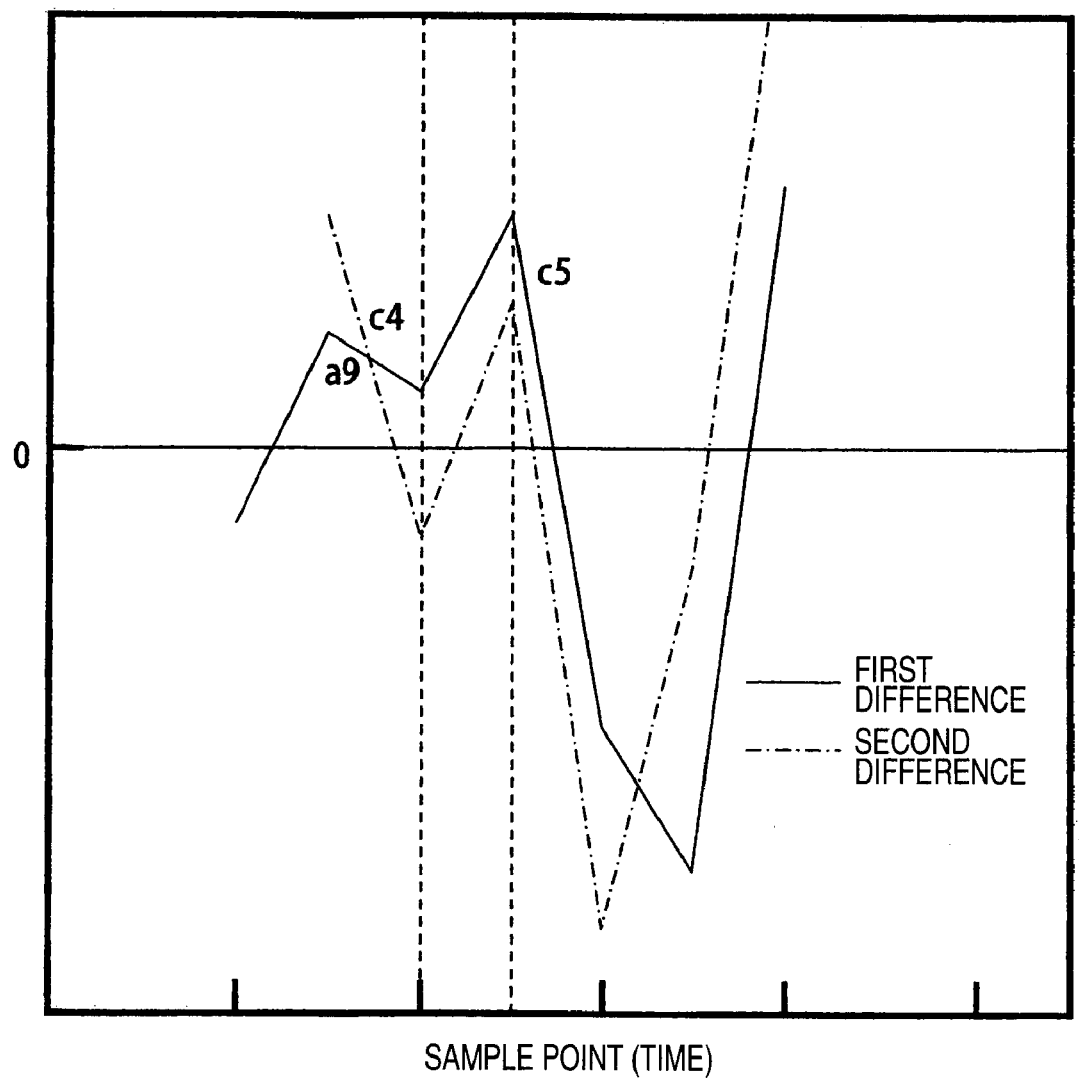
FIG. 6 is a chart showing a result obtained by calculating a first difference and a second difference for each point in FIG. 5.

First, it is decided whether or not a waveform has the bend or indicates an extreme increase/decrease and has such a shape as to generate a large spurious noise. Referring to a sample which is adjacent to a clipped point and a sample in the vicinity thereof, therefore, a first difference and a second difference are calculated. The first difference is a difference from the previous adjacent sample, and the second difference has a value obtained by taking a difference between the first difference and the previous first difference. FIG. 6 shows a result obtained by calculating the first difference and the second difference for each point in FIG. 5. A solid line indicates the first difference and a broken line indicates the second difference.

The fact that the first difference has an extremely large absolute value implies that a waveform thereof is changed very rapidly. Herein, an estimated value of a clipped sample is verified, and in consideration of the fact that the clipping is generated in the vicinity of an apex of the waveform, such an extreme change is unnatural. In the case in which the absolute value of the second difference is extremely large, it implies an extreme change in an acceleration, that is, a rapid change in a waveform, which is also unnatural.

On the assumption that frequency characteristics of the waveform are set to be a first differential and a second differential, they are multiplied by s ($=j\omega$) and $s^2$ in the Laplace transform, respectively. Accordingly, an original signal component subjected to oversampling is decreased by the operations. On the other hand, when there is a large amount of out-band spurious noise, a contribution thereof is increased. By giving a threshold of the absolute value to either or both of the first and second differences to make a decision, accordingly, it is possible to decide that the smoothness is not obtained if the threshold is exceeded for the clipped point.

As another method of utilizing the difference, a change in a sign of the second difference is considered. In the broken line shown in FIG. 6, the second difference is changed from a negative to a positive in a range of c4 to c5. The second difference corresponds to the second differential in a continuous curve. The curve has an inflection point when the second differential is zero. The case of differences is the same. As a matter of course, any waveform has an inflection point. On the assumption that the clipping is generated in the vicinity of the apex of the waveform, and the waveform is subjected to the oversampling and a clipped amplitude is not very large, it is almost impossible to have the inflection point in the vicinity of the apex. In the case in which the inflection point is generated, therefore, there is a high possibility that an estimated value might not approximate to the value before clipping and unnecessary spurious noise might be generated. In the case in which the sign of the second difference is changed between the clipped samples, therefore, it is possible to decide that the waveform obtained by the estimation is not sufficiently smooth.

If it is decided that the waveform is not sufficiently smooth, a high frequency component removal processing is performed. The high frequency component removal processing is a low frequency filtering, for example, averaging or weighted averaging utilizing an FIR (Finite Impulse Response) filter.

As an averaging technique, for example, it is possible to take a method of replacing a value of the clipped point with an average of the points therebefore and thereafter. In the case of c4 in FIG. 5, the values of a9 and c5 are averaged. At this time, c5 is an estimated value through the interpolation and may have a value before the averaging. Then, an average value of c4 itself and the average of a9 and c5 is taken. This operation corresponds to the weighted averaging of the points before and after c4 by a weight of ¼ and point c4 by a weight of ½. It is preferable that coefficients of ¼ and ½ should be optimized depending on a property of a waveform to be treated by the system and a degree of amplitude to be clipped.

2-1-4. Flow of Linear Interpolation Processing in Twice Oversampling

Figure 7:
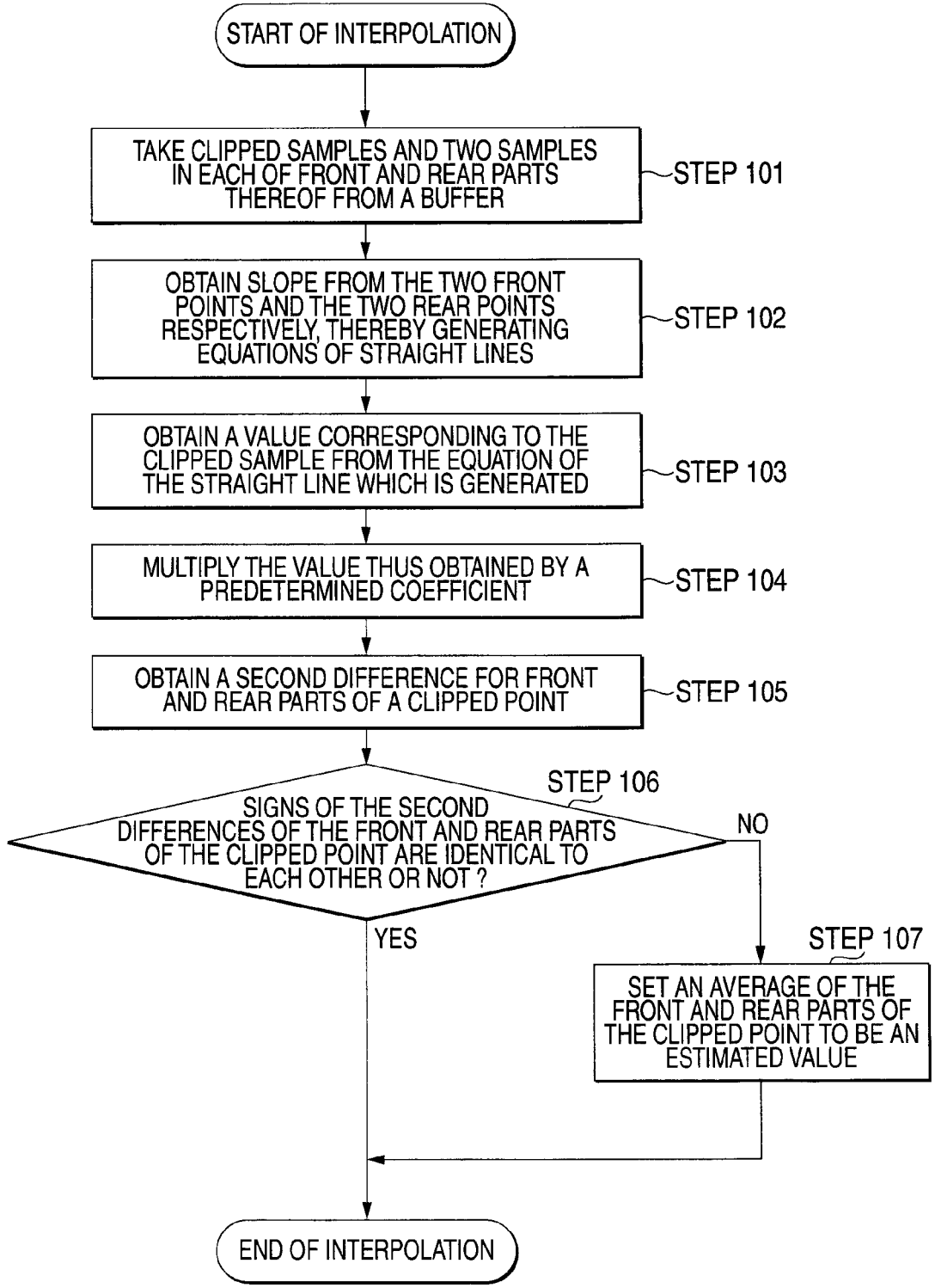
FIG. 7 is a flowchart showing an example of a processing of an interpolating unit in the A/D converting system.

FIG. 7 is a flowchart showing an example of a processing of the interpolating unit 4 in the A/D converting system 1000.

There is shown an example in which the number of collective points subjected to the clipping is two. There is omitted a portion in which a branch is generated depending on the number of the collective clipped points.

Upon receipt of a notice indicative of a generation of the clipping from the clipping detecting unit 3, the interpolating unit 4 starts an interpolation processing.

The interpolating unit 4 first takes clipped samples and samples on two points in each of front and rear parts thereof from the buffer 2 (Step 101).

Next, an equation of a straight line passing through the two front points is obtained and that of a straight line passing through the two rear points is also obtained (Step 102)

Subsequently, values corresponding to the clipped samples are calculated from the equations of the straight lines which are generated (Step 103).

Then, the values obtained in the Step 103 are multiplied by a predetermined coefficient to calculate compressed values (Step 104).

Thereafter, a second difference between a difference between the compressed value and a previous sample from the clipped point and a difference between the previous sample and a sample before the previous sample is calculated. Moreover, a second difference between a difference between a sample immediately after the clipped sample and the compressed value and a difference between the compressed value and the previous sample from the clipped point is calculated (Step 105).

Next, it is decided whether signs of the two second differences obtained in the Step 105 are identical to each other or not. If the signs are identical to each other (Yes in Step 106), the value obtained in the Step 104 is employed as an estimated value on the clipped point and the interpolation processing for the clipped point is ended. On the other hand, if the signs are not identical to each other (No in the Step 106), a moving average using the compressed value and front and rear points thereof with proper coefficients is employed as the high frequency component removal processing (Step 107) and the interpolation processing for the clipped point is ended.

2-1-5. Four Times or More Oversampling and Interpolation of Second or More order Next, description will be given to an example of a technique for performing an interpolation using a polynomial of second or more order at four times or more oversampling.

Figure 8:
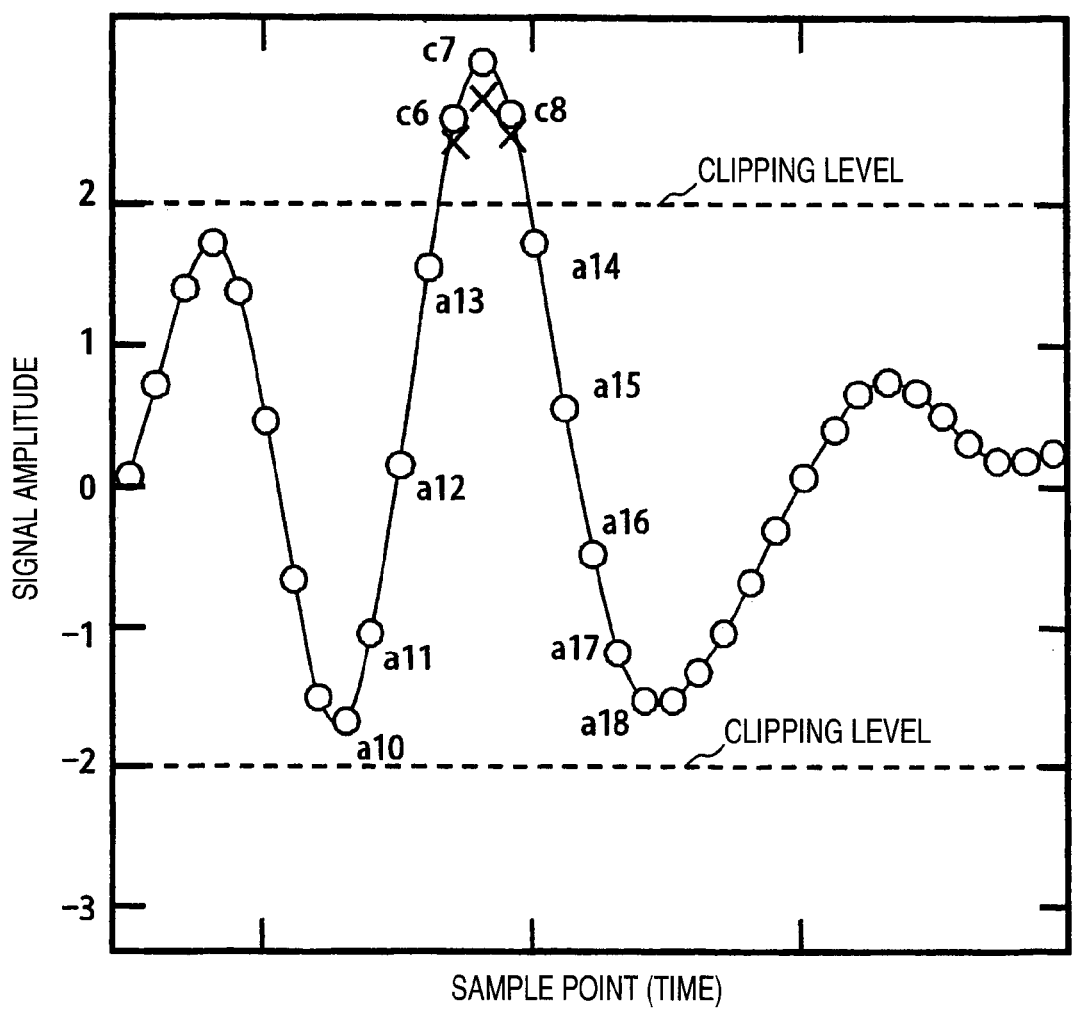
FIG. 8 is a chart showing a cubic polynomial interpolation in four times oversampling.

FIG. 8 shows an example of a part of a waveform in the case in which an OFDM signal obtained by performing a QPSK modulation with 128 subcarriers respectively is subjected to the four times oversampling, and a line shown in white dots and a solid line indicates a waveform corresponding to an original value before an A/D conversion and X represents a value which is estimated by a cubic polynomial interpolation which will be described below.

An example of a cubic polynomial will be described below. Upon receipt of a notice indicative of a clipping from the clipping detecting unit 3, the interpolating unit 4 takes values of collective points subjected to the clipping and two non-clipped points in each of front and rear parts thereof from a sample group held in the buffer 2. Herein, values of from c6 to c8 and from a12 to a15 are taken. Because of the cubic polynomial, four known points are required for obtaining four coefficients of a cubic curve. Herein, the four known points are comprised of two points in each in front of and in rear of the clipped samples. Four coefficients of the cubic polynomial are obtained from the four points from a12 to a15 to determine the cubic curve, and times on sample points corresponding to c6 to c8 are substituted to the curve to obtain three estimated values. As a result, points shown in X of FIG. 8 are obtained.

A method of uniquely determining a cubic curve from four points is the simplest. There is also a method of obtaining a plurality of cubic curves by utilizing four points or more and calculating coefficients in order to connect their first and second derivatives. In order to obtain estimated values on the clipped points of c6 to c8, for example, values from a last minimum or maximum known point to a minimum or maximum known point thereafter are taken from the buffer. In the example of FIG. 8, values on points from a10 to a18 are taken.

Referring to respective points from the first point to the point of two samples before the clipped point among points from a10 to a18, an equation for a cubic curve is derived by using three points including the point and two adjacent points. Since there are only three known points in the equation, the points are insufficient for obtaining four coefficients. Therefore, there is obtained a plurality of equations in a state of lacking one coefficients in each equation. In that state, equations of first and second derivatives are obtained for respective curves. A general equation of the derivative is identical for a cubic curve. Therefore, calculations on a coefficient of the equation of the derivative for each of the curves will be performed. When simultaneous equations are set up and solved in such a manner that the derivatives thus obtained are coincident with each other for adjacent cubic curves of known points, the unknown coefficient remained can be calculated. According to the method, it is possible to obtain a curve for smoothly connecting at least five points which cannot merely approximate completely in the cubic curve. Estimated values of clipped samples can be obtained by substituting times of the sample points of c6 to c8 for one of the curves thus obtained which is passing through a13 and a14.

The interpolating unit 4 overwrites the estimated value thus obtained to a position of original data in buffer 2.

Figure 9:
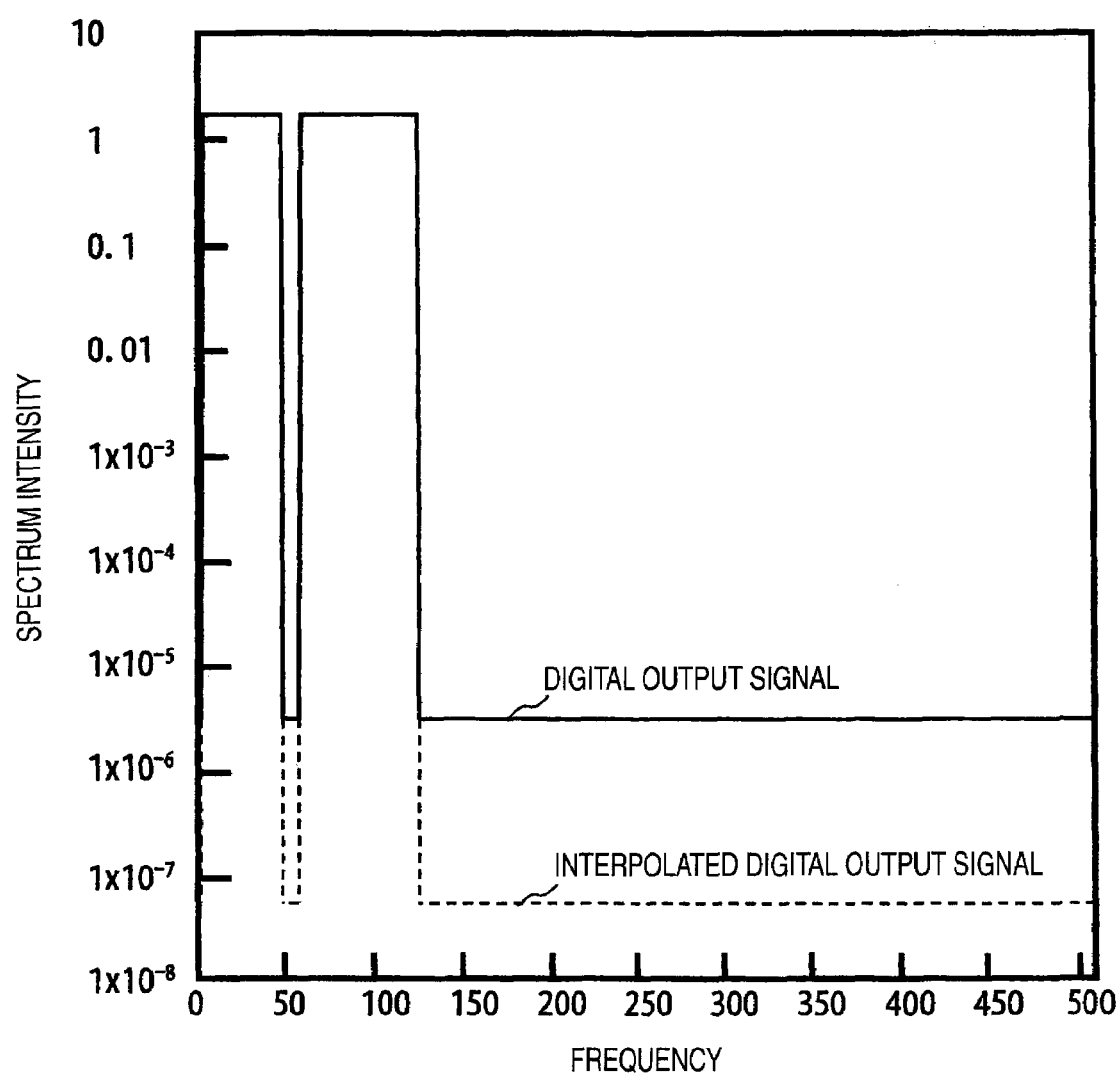
FIG. 9 is a chart showing a state of a spurious noise suppression which is obtained by the cubic polynomial interpolation.

FIG. 9 shows an example of a result obtained by simulating a state of a spurious noise suppression of the OFDM signal in the algorithm.

A solid line indicates a spectrum just after clipping by the A/D converter 1 (that is, of a digital output signal), and a broken line indicates a spectrum in a state in which values of clipped points are estimated by using the interpolating algorithm for performing the coincidence of derivatives in cubic polynomials (that is, of an interpolated digital output signal).

The OFDM signal is generated up to the vicinity of a frequency of 128. Subcarriers in DC and the vicinity of 50 to 60 are intentionally removed for spurious noise observation. It is apparent that uniform spurious noise having a spectrum intensity of approximately $10^{-6}$ to $10^{-5}$ is generated on a frequency from which the subcarriers are intentionally removed in the clipping state shown in the solid line. On the other hand, it is apparent that the spurious noise is suppressed by approximately 20 dB in the interpolated digital output signal shown in the broken line.

In the case in which the cubic polynomial is utilized, it is not necessary to verify smoothness. The reason is that a bending way is limited and a fine bend is not generated unnecessarily if cubic polynomial is utilized.

The same processing can also be performed in a quadratic polynomial. In the case of the quadratic polynomial, one quadric function is obtained from three known points. If the derivative is used, an equation having one or two unknown coefficients is obtained and other simultaneous equations are solved in such a manner that the adjacent derivatives to each other are coincident with each other in the same manner as in the case of the cubic polynomial.

In some cases in which a polynomial interpolation is used including a linear interpolation, a result of estimation may be less than the clipping level. In these cases, it is preferable that the estimation should not be performed but the value of clipping level should be applied as it is.

There has been described the example in which the polynomial is utilized.

2-2. Method of Utilizing Convolution of SINC Function

Next, description will be given to a method of utilizing a convolution of an SINC function.

Figure 10:
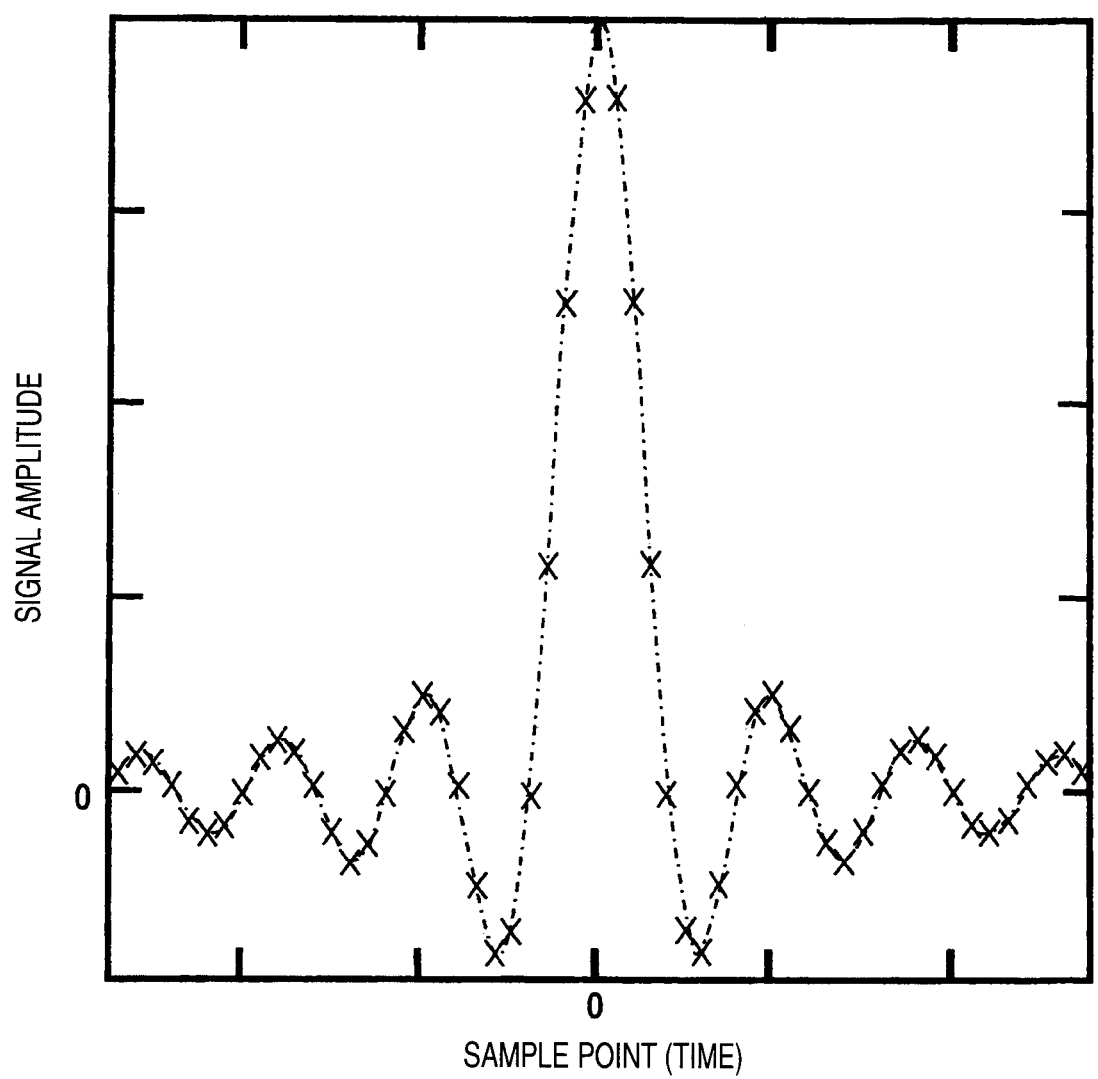
FIG. 10 is a chart showing an SINC function corresponding to the four times oversampling.

A curve of points marked in X in FIG. 10 shows an example of the SINC function (sinc(t/4) for time t) in the case of four times oversampling. This corresponds to an impulse response obtained by performing the inverse Fourier transform of a rectangular low pass filter from DC to a quarter of an oversampling frequency (that is, a signal frequency of the analog input signal). In the case of twice oversampling, there is obtained a waveform of an impulse response corresponding to a low pass filter from the DC to a half of the oversampling frequency. It looks like a waveform connecting only even-numbered sample points in the waveform shown in FIG. 10.

The impulse response continues from an infinite past to an infinite future in principle. However, in digital signal processing, it is defined by the number of samples of Fourier transformation. In respect of an actual calculation, that number and the corresponding calculation are excessively large. In consideration of the fact that the SINC function has an envelope reduced apart from a time of zero and a contribution is lessened, generally, the number of samples that are utilized from the time of zero is determined.

There are some conditions for correctly performing the interpolation with the SINC function.

As a first condition, the collective point having a clipping level is equal to or smaller than a number obtained by subtracting one from the oversampling times n (n=4 for four times and n=2 for twice), that is, three or smaller for the four times and one or smaller for the twice.

As a second condition, other points having the clipping level are not included in the samples used in the convolution of the SINC function.

For the former condition, the residual samples having the clipping level excluding a maximum number of samples which can be interpolated from the collective clipped points can be regarded to be included in the samples used in the convolution. Accordingly, it is possible to regard the two conditions to be actually identical and the only condition is that the other points having the clipping level should not be included in the points used in the convolution.

Figure 11:
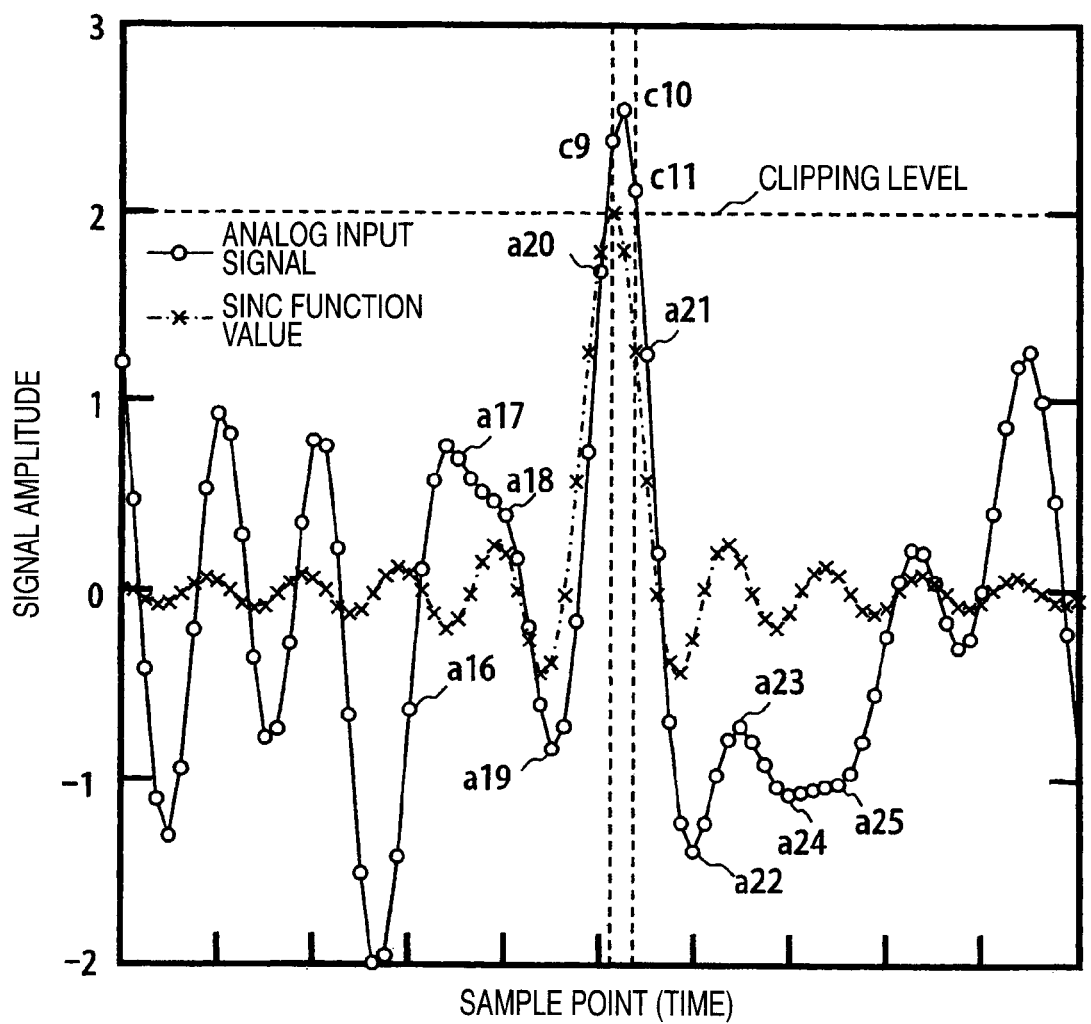
FIG. 11 is a chart showing an analog input signal and the SINC function of the four times oversampling.

An example of the calculation in the case of the four times oversampling will be described below with reference to FIG. 11. In FIG. 11, a sample value shown in white dots corresponds to an analog input signal before A/D conversion by the A/D converter 1. Moreover, a waveform shown in a solid line is a line connecting the values of the analog input signals. In FIG. 11, three samples (c9, c10, c11) having the clipping level are present at a time in the vicinity of a center in a direction of horizontal axis.

The interpolating unit 4 takes every four samples, (that is, a number corresponding to the oversampling times n) so as not to include the other points having the clipping level from samples before and after the collective clipped samples (before c9 or after c11). In the case of FIG. 11, the number of the collective clipped samples is three, that is, c9, c10 and c11. Preventing them from being included, every four samples are taken, for example, five points from a16 to a20 before the collective clipped points and five points from a21 to a25 after the collective clipped points are taken. As described above, it is preferable to properly determine and utilize the number, for example, the number of points before and after a time of 0 of the SINC function. For this reason, it is apparent that the number of the points is not limited to be five.

Next, the SINC function is superposed on the sample thus taken in such a manner that the time 0 of the SINC function in FIG. 10 is aligned to a time of the sample c9 (that is, a first one of the collective clipped points). FIG. 11 shows the SINC function in a one-dotted chain line and X.

Referring to each of every four samples which are taken, then, an amplitude value thereof is multiplied by a value of the SINC function corresponding to times of the samples to obtain all of sums.

The sum is multiplied by a proper factor to perform a adjustment corresponding to a scale of the amplitude of the SINC function. If the original SINC function is scaled to have a value which does not need to be adjusted, it is not necessary to perform the adjustment. In FIG. 11, the SINC function amplitude is large to be seen easily, and therefore, it is necessary to perform a scaling regulation with a proper factor if the values indicated are used as they are.

A value thus obtained is set to be an estimated value of the time corresponding to the sample c9. Referring to the samples c10 and c11, similarly, 0 of the SINC function is aligned to each time again to perform the same calculation so that an estimated value is obtained.

Figure 12:
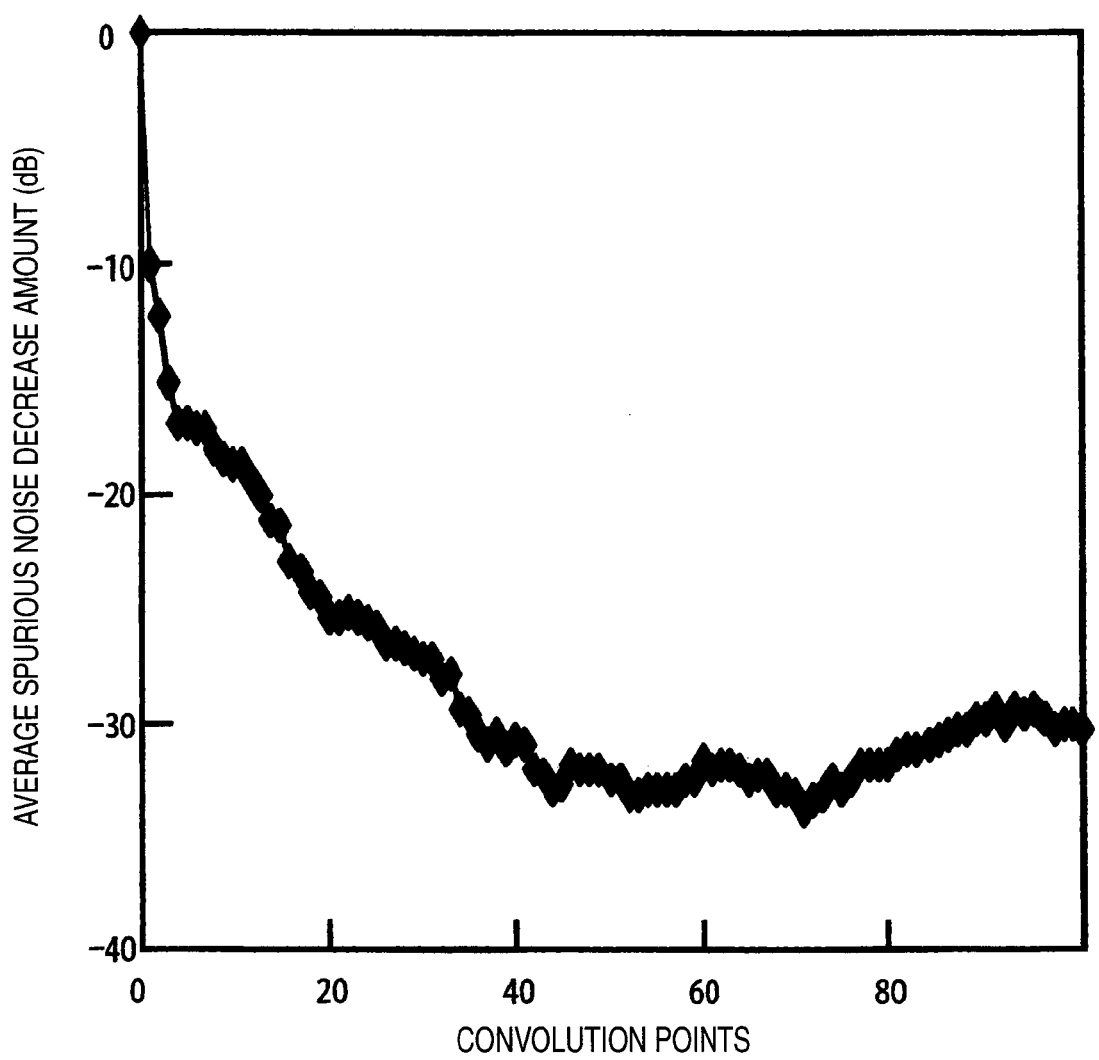
FIG. 12 is a chart showing a simulation result obtained by performing the spurious noise suppression through a method of convoluting the SINC function.

The number of the points before and after the point having the clipping level which are to be taken depends on an extent of the spurious noise to be suppressed. FIG. 12 is a graph showing a simulation result obtained by generating a clipping in only one place over one symbol of the OFDM signal in the case in which 128 subcarriers are modulated by QPSK respectively and performing the spurious noise suppression by the convolution of the SINC function. The horizontal axis indicates point number used in convolution, and the vertical axis indicates a spurious noise suppression amount. The zero point in the horizontal axis indicates the case in which nothing is performed, and the amount of the spurious noise is normalized to zero (dB) The point in the horizontal axis indicates the number of samples on either side before or after the clipped point, that is, every four samples on either side in the case of the four times oversampling. Since the samples are actually taken before and after, a twice number of samples are taken. The vertical axis indicates an amount of spurious noise appearing on the outside of the band of OFDM. Since a fluctuation is caused depending on a waveform, FIG. 12 is only an example. Apparently, it is possible to perform a spurious noise suppression of approximately 20 dB by taking approximately 10 to 20 samples on either side and it is possible to perform a suppression of 30 dB by taking approximately 40 samples on either side in order to obtain a more excellent performance. Depending on a practical circuit scale, a calculating time and a spurious noise suppressing performance which is required, accordingly, it is preferable to take approximately 10 to 20 samples on either side in a normal suppression and to take approximately 40 samples on either side if a higher degree of the suppression is required.

The interpolation using the SINC function is basically the same operation as upsampling. As long as the SINC function in a correct format is utilized, therefore, it is possible to automatically obtain such an estimated value as to satisfy a predetermined smoothness corresponding to the number of oversamplings.

In the operation, every n points are used corresponding to the oversampling times n. For this reason, there is no problem if the clipped sample is present in a point which is not used in the convolution. In the case in which one or two collective points is/are clipped in the four times oversampling case, therefore, the way of taking every four samples has a degree of freedom. Consequently, it is preferable to shift the points to be taken if the other clipped points can be avoided.

Referring to the interpolation using the SINC function, other clipped points should not be present in the sample to be used for the calculation and the restriction is strict. However, the spurious noise suppressing performance is more excellent than that in a polynomial. Therefore, it is preferable to apply the interpolation to the case in which a comparatively small clipping is caused very rarely.

Figure 13:
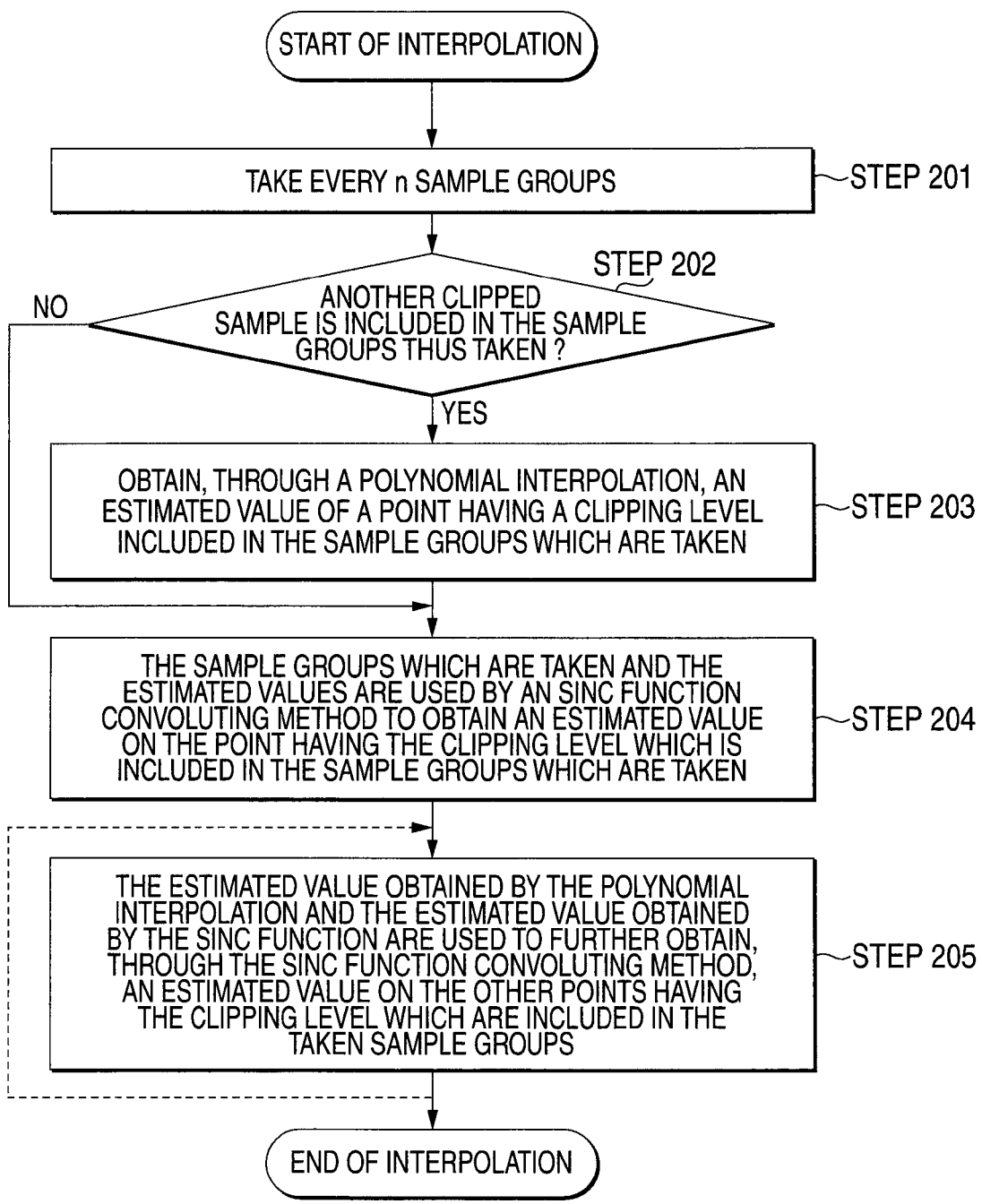
FIG. 13 is a flowchart showing an example of a method of utilizing a polynomial interpolation and the convolution of the SINC function.

2-3. Combination of Polynomial Interpolation and Method of Utilizing Convolution of SINC Function A configuration for making the best of advantages of a polynomial interpolation and a method of utilizing a convolution of the SINC function will be described below with reference to FIG. 13.

First, every n samples to be used for a convolution calculation of the SINC function are taken (Step 201).

If the other clipping is present in the sample group which is taken (Yes in Step 202), an estimated value on another point having the clipping level included in the sample group which is taken is obtained by a polynomial interpolation (Step 203). It is sufficient that an interpolating procedure is the polynomial interpolation described above. Since the number of the samples to be used for the interpolation is small in the polynomial interpolation, the other points having the clipping level are hardly included.

The case in which the other clipping is present in the sample group which is taken also includes the case in which at least n points having the clipping level are originally present continuously in a sample group subjected to oversampling.

If the other clipping is not present in the sample group which is taken (No in Step 202) or an estimated value on the point having the clipping level is obtained from the polynomial interpolation as described above at the Step 203, the sample group which is taken and an estimated value on the point having the clipping level are used in a convolution technique of the SINC function to obtain the estimated value on the point having the clipping level included in the sample group which is taken (Step 204).

By using the estimated value on the point having the clipping level which is obtained by the polynomial interpolation (that is, the estimated value obtained in the Step 203) and an estimated value based on the SINC function on the point having the clipping level included in the sample group which is taken (that is, an estimated value obtained in Step 204), furthermore, the estimated value based on the SINC function is calculated at a time corresponding to the estimated value of the other sample having the clipping level obtained by the polynomial interpolation (Step 205).

In the case of the SINC function interpolation, the number of the points to be utilized is large. Therefore, a contribution of each point is comparatively small. If the estimated value obtained by the polynomial interpolation has an approximately near value to an original value, a result of the calculation performed by the convolution of the SINC function is very near to an expected value. Also in the case in which the number of the samples of the collective clipping is equal to or greater than n, if the sample which is first subjected to the polynomial interpolation is the end sample of collective clipped samples, the sample is near to the non-clipped samples, and therefore, the result is comparatively near to an expected value. Consequently, if the other points are subjected to an SINC function interpolation by using the first estimated value, an error is not greatly increased.

In some cases, the estimated value on the point having the clipping level which is obtained by the polynomial interpolation may be sufficient depending on precision in a request. Therefore, it is also possible to propose a configuration in which the Step 205 is not performed.

To the contrary, if estimated value obtained by the method should approximate more to the value of the analog input signal, the method of convolving the SINC function may be further applied to the estimated value obtained in the Step 205 to repeat the interpolation. More specifically, the SINC function interpolation is performed over the clipped point again based on the sample group which is once subjected to the SINC function interpolation. The number of repetitions may be defined, or when they are repeated, the estimated value converges, and therefore, a reference value may be set to perform the repetition until the value is converged.

Figure 14:
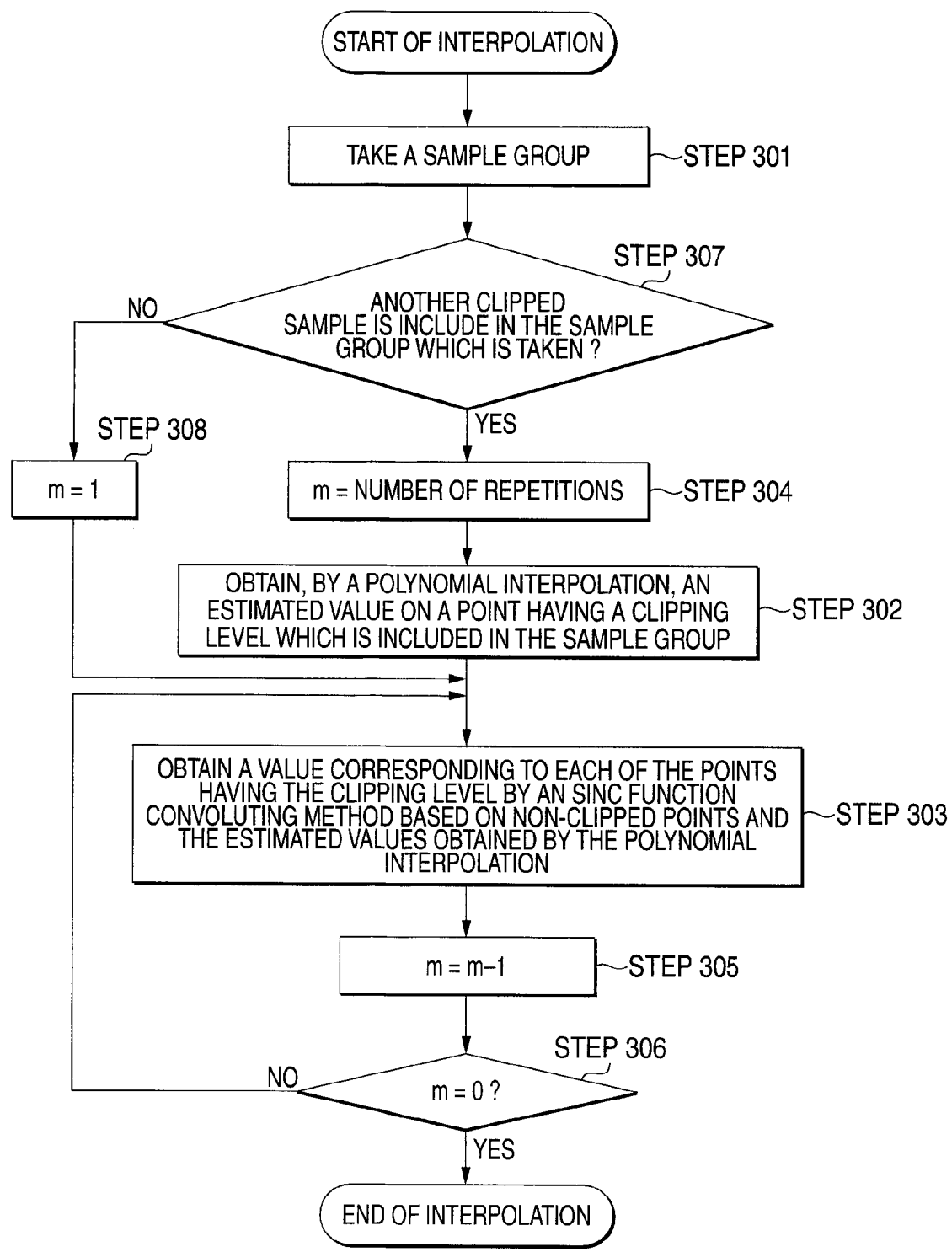
FIG. 14 is a flowchart showing another example of the method of utilizing the polynomial interpolation and the convolution of the SINC function.

The method may be developed as shown in FIG. 14.

First, a sample group to be used in a convolution calculation of the SINC function is taken (Step 301). The sample group to be taken is not limited to every n sample groups but may be consecutive point groups. Moreover, the number of the samples is not particularly limited. For example, all of the samples held in the buffer 2 may be taken.

Next, all of estimated values on a point having a clipping level are obtained by a polynomial interpolation (Step 302).

Then, non-clipped points and an estimated value group obtained by the polynomial interpolation are used for the convolution calculation of the SINC function to obtain their SINC function interpolation values (Step 303).

If necessary, steps for counting down the number of repetitions, for example, Steps 304, 305 and 306 shown in FIG. 14 may be added to further repeat a processing of obtaining an SINC function interpolation value based on the SINC function interpolation values calculated at the Step 303.

Moreover, it can be detected beforehand whether or not the other clipped samples are included in a sample group to be used in the SINC function interpolation (Step 307). If the other clipped sample is not included, the polynomial interpolation is not performed (No in Step 307), and furthermore, a step (Step 308) of preventing the SINC function interpolation from being repeated may be added.

By the above method, it is possible to obtain a spurious noise suppressing performance which is near to the SINC function interpolation by using the polynomial interpolation also on the point having the clipping level which does not satisfy the condition of the SINC function interpolation.

3. AGC (Automatic Gain Control) Corresponding to Frequency of Clipping

The A/D converting system 1000 described above serves to estimate a clipped point in a digital output signal using non-clipped points, that is, to estimate a signal lacking information from a surrounding signal thereof. In other words, the information is originally lacked in a stage in which an analog input signal is converted into a digital output signal. Therefore, it is physically impossible to make the digital output signal to be perfectly coincident with the analog input signal. If the degree and frequency of the clipping is low, it is possible to perform such spurious noise suppression as to be estimated with somewhat accuracy at most.

It is hard to perform estimation with high precision, if the occurrence frequency of the clipping is very high, or amplitude of the clipped amplitude is extremely large, or the number of the collective clipped points is excessively large compared with the oversampling times.

Figure 15:
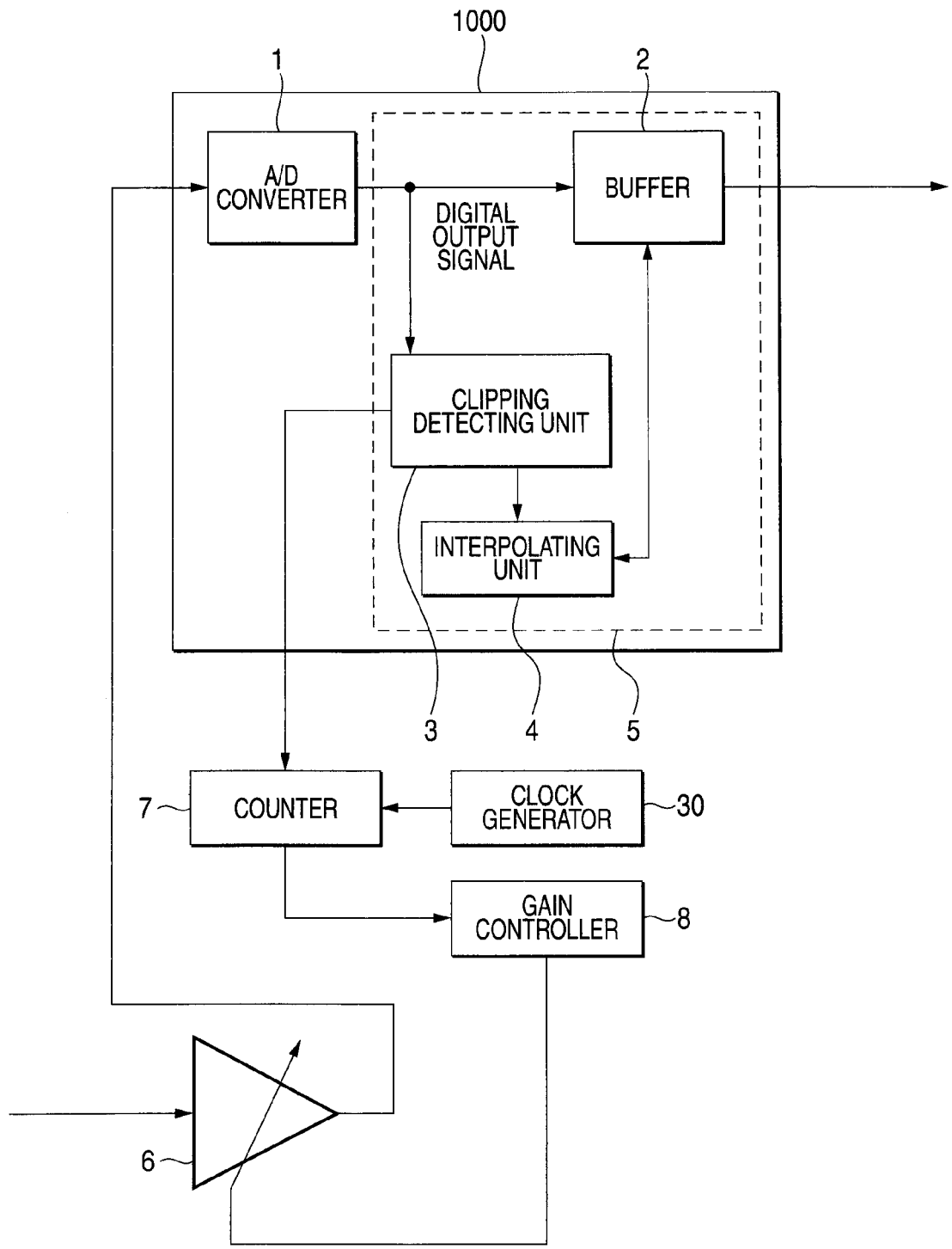
FIG. 15 is a block diagram showing a configuration in which a structure for regulating input amplitude of the A/D converting system is added.

As shown in FIG. 15, therefore, the amplitude of the analog input signal to the A/D converter 1 is preferably controlled corresponding to a frequency of clipping.

FIG. 15 shows a configuration in which a block for controlling an input amplitude thereof is added to the A/D converting system 1000. In FIG. 15, a variable gain amplifier 6, a counter 7, a gain controller 8 and a clock generator 30 are provided in addition to the structure of the A/D converting system 1000.

The clock generator 30 generates a clock signal to be supplied to the counter 7. The counter 7 calculates a frequency at which a clipping is detected on the digital output signal by the clipping detecting unit 3 with respect to a time indicated by the clock signal generated by the clock generator 30. In the configuration, the clock generator 30 and the counter 7 function as a frequency measuring unit. The clock signal does not need to be generated by a clock generating mechanism dedicated to the frequency measuring unit. A clock signal used in the other portions of the A/D converting system 1000 may be applied or a clock signal in the other portions of an apparatus incorporating the A/D converting system 1000 may be applied if possible.

The gain controller 8 controls a gain of the variable gain amplifier 6 based on the frequency calculated by the counter 7. More specifically, the gain of the variable gain amplifier 6 is reduced when the frequency calculated by the counter 7 is high, and is increased when the frequency calculated by the counter 7 is low. The variable gain amplifier 6 outputs, to the A/D converter 1, an analog input signal obtained by amplifying an input signal with a gain to be controlled by the gain controller 8. The variable gain amplifier 6 may be a variable attenuator and any structure including an amplitude adjusting mechanism within a certain range is sufficient. In the configuration, the gain controller 8 and the variable gain amplifier 6 function as an amplitude adjusting unit.

The calculation of the frequency by the counter 7 may be performed at a regular time interval (a certain clock interval). It may be performed every time the clipping detecting unit 3 detects the clipping level on the digital output signal in the case in which the frequency is increased suddenly and remarkably (for example, in the case in which a last calculated frequency exceeds a predetermined threshold). A frequency of the frequency calculation may be increased by other means. If a structure in which the frequency of the frequency calculation is variable is employed, thus, it is preferable to output the frequency of the frequency calculation, that is, the number of clocks in which measurement is performed together with the frequency calculation result.

Figure 16:
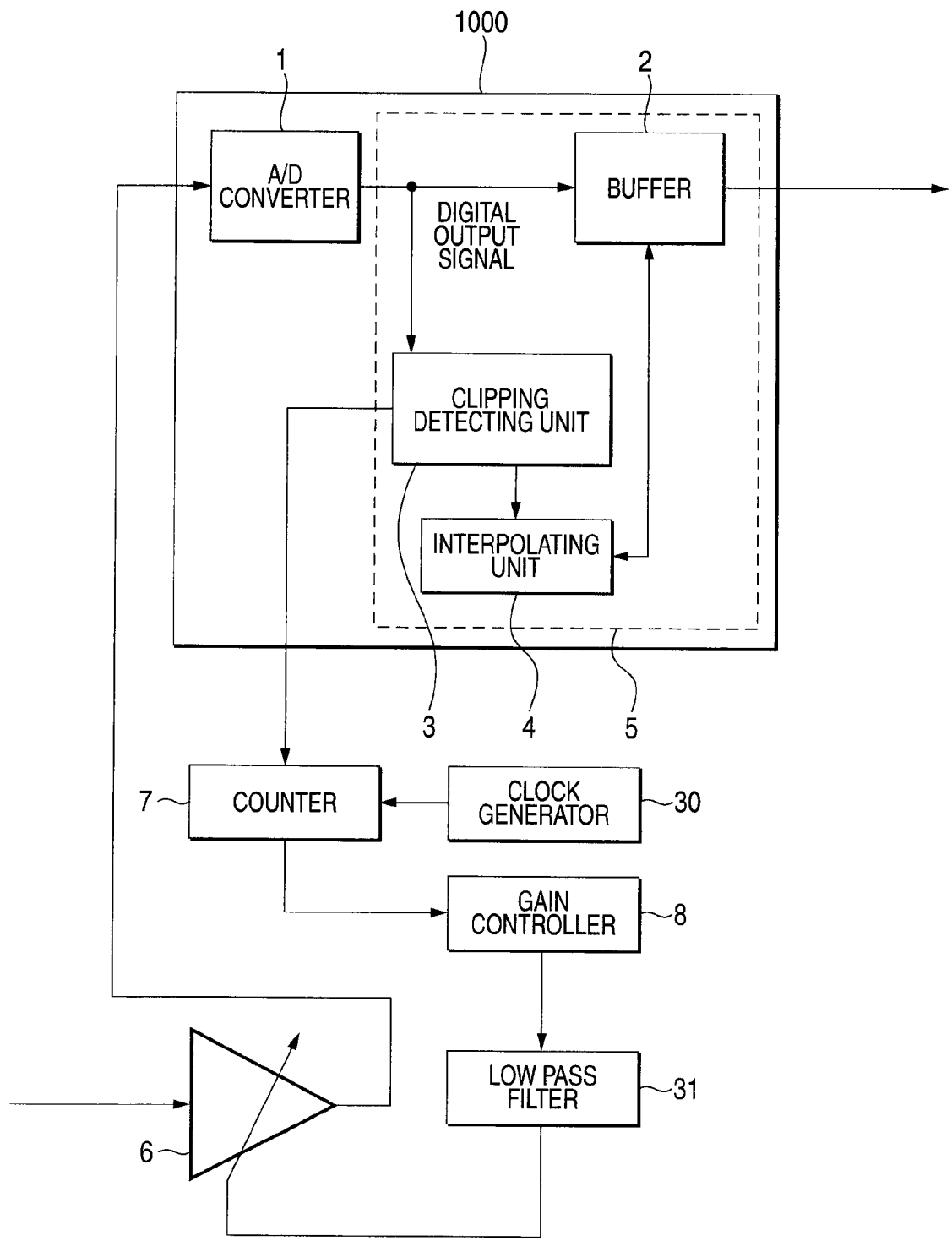
FIG. 16 is a block diagram showing a configuration in which a low pass filter is added to the structure for regulating the input amplitude of the A/D converting system.

On the other hand, in the case in which a structure for adjusting the amplitude of the analog input signal to the A/D converter 1 corresponding to a frequency of clipping is applied to a cognitive radio terminal, it is preferable to employ a structure in which a gain control signal output from the gain controller 8 is supplied to the variable gain amplifier 6 through a low pass filter 31 having a large time constant as shown in FIG. 16.

A signal picked up when the cognitive radio terminal performs the carrier sensing is a random signal for itself which cannot be controlled by itself, for example, a signal of another license system, and an interval at which the clipping is generated is also random for itself. Accordingly, a state in which a clipping frequency is high might be maintained continuously for a somewhat long period of time. To the contrary, two or three clippings are temporarily generated at a close interval.

When the gain of the variable gain amplifier 6 is reduced for a temporary increase in a clipping frequency, a signal amplitude is limited over a long time. However, large information is necessary for the gain controller 8 to decide whether the clipping frequency increased temporarily or not, and an algorithm is complicated. For this reason, there is employed a structure in which the gain control signal output from the gain controller 8 is supplied to the variable gain amplifier 6 through the low pass filter 31 having a longer time constant than a period for which the cognitive terminal performs carrier sensing, and a quick change in the gain control signal is avoided (that is, a high frequency component is removed) and a slow gain control is performed.

4. Application to Cognitive Radio Terminal

Figure 17:
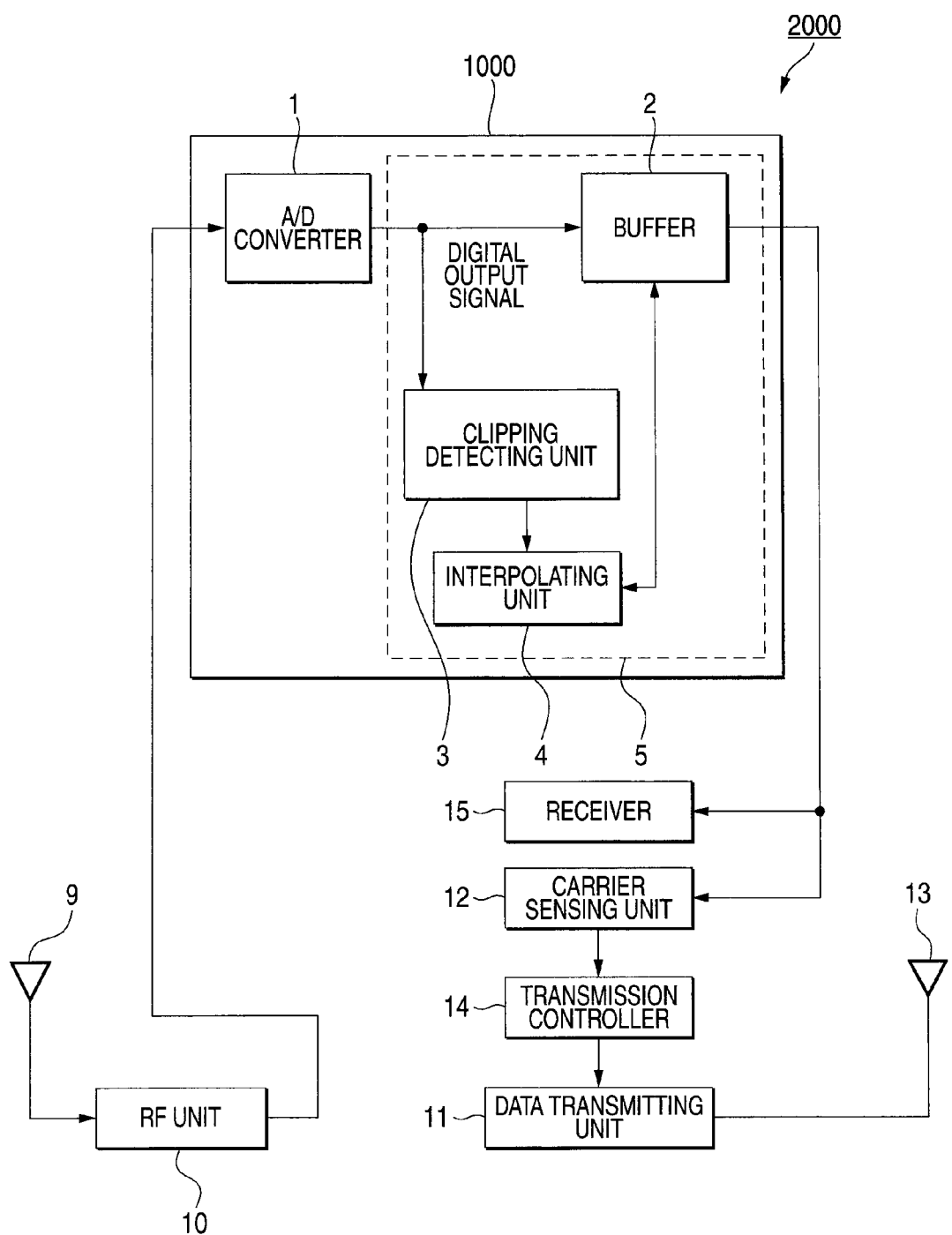
FIG. 17 is a block diagram showing a cognitive radio terminal comprising the A/D converting system.

FIG. 17 shows an example in which the A/D converting system 1000 is applied to a cognitive radio terminal. Description is based on the A/D converting system 1000 in FIG. 1, but however, it is apparent that the structures shown in FIGS. 15 and 16 may be applied.

A cognitive radio terminal 2000 includes a receiving antenna 9, an RF unit 10, a carrier sensing unit 12, a transmission controller 14, a data transmitting unit 11, and a transmitting antenna 13 in addition to the structure of the A/D converting system 1000.

The RF unit 10 down-converts a radio wave received by the receiving antenna 9 into a baseband or low IF (Intermediate Frequency) to be a frequency of an analog input signal.

The A/D converting system 1000 performs the processing for the analog input signal output from the RF unit 10, thereby outputting an interpolated digital output signal to a receiver 15 and the carrier sensing unit 12.

The receiver 15 demodulates the interpolated digital output signal for a data transmission period and acquires data transmitted from another cognitive radio terminal to be a communication partner.

The carrier sensing unit 12 analyzes the interpolated digital output signal for the carrier sensing period and analyzes whether or not other signals (particularly, a signal transmitted by a licensed system) are present in a frequency band which the data transmitting unit 11 tries to use.

The transmission controller 14 receiving a notice of a result of the analysis gives an instruction to the data transmitting unit 11 so as to stop a transmission in the frequency band if the other signals are present in the frequency band which tries to be used. If the other signals are not detected in the carrier sensing period, the data transmitting unit 11 is permitted to use the frequency band and the data transmitting unit 11 generates a radio signal and outputs the radio signal from the transmitting antenna 13.

By the A/D converting system 1000, the generation of spurious noise by the clipping can be suppressed. Therefore, it is possible to detect other signals with a high sensitivity. Thus, it is possible to accurately perform carrier sensing in the cognitive radio system. Furthermore, it is not necessary to perform an estimation for non-clipped sample and to perform fetching and overwriting. In the case in which there is no clipping, therefore, it is also possible to use a calculating resource in other works (for example, an increase in a speed of a carrier sense processing and a digital modulation processing of transmission data).

There are various carrier sensing methods in the cognitive radio terminal 2000. In some cases in which a transmission bandwidth of a cognitive terminal is remarkably greater than the other transmission bandwidths to be detected, there is employed a configuration in which a high speed orthogonal transformation such as FFT (fast Fourier transform) is used in the carrier sensing unit 12 to perform carrier sensing for a plurality of frequencies at the same time. The high speed orthogonal transformation is not limited to the FFT but may be a fast wavelet transformation, for example. Description will be given by taking the FFT as an example.

In the FFT processing, a buffer memory for holding the collective number of samples is required depending on a bandwidth which is detected and a resolution to be analyzed. A large number of collective samples are once stored in the buffer, although not necessarily all of the FFT sample points. In the structure of cognitive radio terminal 3000 shown in FIG. 18, the buffer 2 plays a role of a buffer for FFT.

Figure 18:
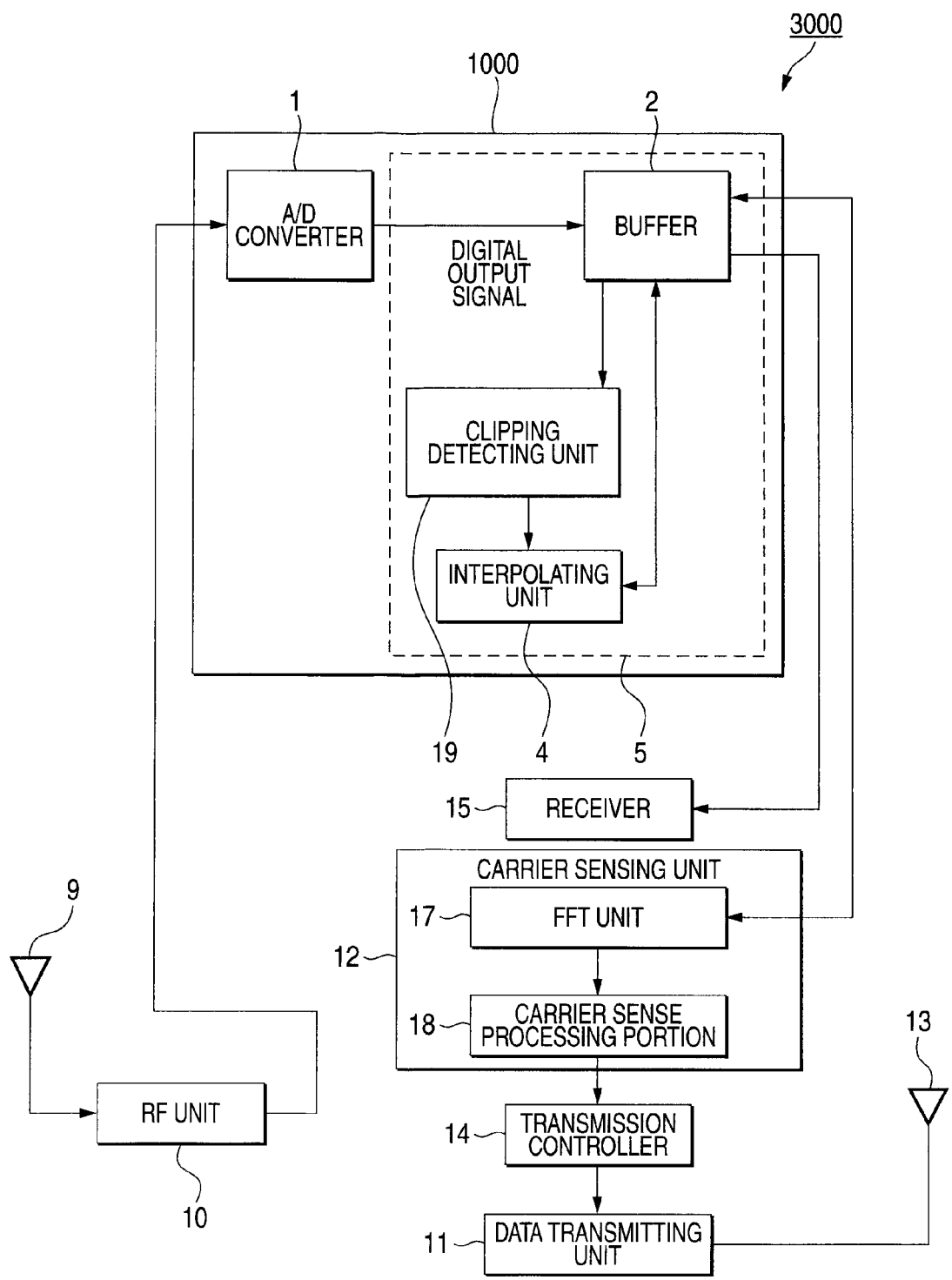
FIG. 18 is a block diagram showing a structure using an FFT in a carrier sense in the cognitive radio terminal comprising the A/D converting system.

In the example of FIG. 18, the buffer 2 serves as a buffer for storing a plurality of samples for an FFT calculating portion 17 in the carrier sensing unit 12. In the FFT calculation, the somewhat number of collective samples are once stored in the buffer 2. Therefore, it is not necessary to directly detect the generation of the clipping from the digital output signal of the A/D converter 1 as shown in FIG. 1 but it is also possible to employ a configuration in which a plurality of samples stored in the buffer 2 are successively fetched in a storing state in the buffer 2 to detect the clipping as shown in FIG. 18. As a matter of course, it is also possible to directly perform the detection from the digital output signal in the same manner as in FIG. 1.

The interpolating unit 4 performs the processing for the samples which are once stored in the buffer 2. In the case in which the processing to be executed is a combined processing of a polynomial interpolation and an SINC interpolation together or a processing of repeating the SINC interpolation, however, it is desirable to collectively perform the polynomial interpolation and then the SINC function interpolation collectively over a part or all of the samples stored in the buffer 2.

When the FFT is to be performed, a sample group is multiplied by a proper window function to reduce alias generation. A waveform of a function to be usually used for the window function is, for example, one-period sine wave or a gaussian waveform. Referring to the window functions, such a waveform has an amplitude of gradually decreasing to zero near the ends of the sample group subjected to FFT. In the case in which the interpolation processing is performed over a large number of samples stored in the buffer 2 at a time, there is a possibility that a sufficient number of samples for the interpolation processing might not be obtained for a clipped point placed at the ends on both sides on a time basis. Two coping methods will be described below.

As a first method, there is taken a spurious noise suppressing method to be performed after multiplying (windowing) the window function. When the FFT window approaches the end, a value approximates to zero. Therefore, a signal on an outside of a clipped point near to the end has a value zero after multiplying the window function. Accordingly, it is possible to treat the value to be zero and to progress the calculation assuming there is no sample at an outside. In this case, it is necessary to perform the calculation after multiplying the window function. After multiplying the window function, the clipped point does not have a clipping level value. For this reason, the clipping detecting unit 3 is to detect any point subjected to the clipping from a signal obtained before multiplying the window function, thereby giving a notice to the interpolating unit 4. If possible, a more excellent estimation can be performed when number of points to be used in an inside of the window from the clipped point is increased corresponding to a decrease of the samples on the outside of the window.

As a second method, there is taken a method of storing the samples on the outside of the sample group to be used for the interpolation processing. More specifically, necessary points for the current processing of the interpolating unit 4 are left from the rearmost part of the previous sample group. Moreover, a slightly larger number of samples corresponding to the necessary points for the processing of the interpolating unit 4 than necessary points for the current FFT calculation are stored in the buffer 2 to perform the interpolation processing. When the interpolation processing is ended, only a necessary portion for the FFT is fetched and transferred to the FFT stage and the samples of previous sample group is discarded, and a portion in a rear part of the FFT window and an excessively stored portion are moved forward for the processing of the next sample group.

The portion thus subjected to the interpolation processing is transmitted to the FFT calculating portion 17 in the carrier sensing unit 12 and is subjected to the FFT calculation processing. From the result, then, a carrier sense processing portion 18 detects the presence of other signals.

In the method of performing the FFT, if a processing capability of the carrier sensing unit 12 has a margin, a result of the interpolation is once subjected to the FFT calculation processing. From the result, the amount of spurious noise is calculated. If a large amount of the spurious noise according to the clipping is left, the interpolation processing may be executed again. In the case of a polynomial processing, a correction factor is reconsidered and an averaging processing coefficient is reexamined. In the case of a method of using the SINC function, a repetition processing is performed.

As described above, there is provided a technique that suppresses spurious noise caused by a clipping by interpolating a signal subjected to the A/D conversion with a proper interpolation function. This technique can be performed without knowing a signal before an A/D conversion, without increasing the number of quantization bits and without damaging a receiving sensitivity.

It is to be understood that the present invention is not limited to the specific embodiments described above and that the present invention can be embodied with the components modified without departing from the spirit and scope of the present invention. The present invention can be embodied in various forms according to appropriate combinations of the components disclosed in the embodiments described above. For example, some components may be deleted from all components shown in the embodiments. Further, the components in different embodiments may be used appropriately in combination.

What is claimed is:

1. An analog-digital converting apparatus, comprising:
   an analog-digital converting unit that performs a conversion from an analog input signal into a digital output signal;
   a buffer unit that temporarily stores the digital output signal for a plurality of samples and outputs the samples in time-series;
   a clipping detecting unit that detects a first sample having a signal value corresponding to a clipping level of the analog-digital converting unit from among the samples of the digital output signal; and
   an interpolating unit that rewrites the signal value of the first sample stored in the buffer unit into an estimated signal value that is obtained by estimating a signal value at a time corresponding to a time of the first sample by an interpolation using at least one of (1) a set of second and third samples that are samples previous to the first sample and (2) a set of fourth and fifth samples that are samples subsequent to the first sample;
   wherein the clipping detection unit includes:
   a frequency measuring unit that measures a frequency at which a sample having a signal value corresponding to the clipping level of the analog-digital converting unit is detected; and
   an amplitude adjusting unit that changes an amplitude of the analog input signal corresponding to the frequency measured by the frequency measuring unit.

2. The apparatus according to claim 1, wherein the analog-digital converting unit performs the conversion into the digital output signal at an oversampling rate that is equal to or larger than twice of a frequency of the analog input signal, and
   wherein the interpolating unit obtains the estimated signal value so as to satisfy a predetermined smoothness for the oversampling rate between the estimated signal value and values of at least two samples used in the interpolation from among the second sample, the third sample, the fourth sample and the fifth sample.

3. The apparatus according to claim 1, wherein the second sample is a sample nearest to the first sample in a group of samples previous to the first sample and having signal values not corresponding to the clipping level,
   wherein the third sample is a sample immediately previous to the second sample,
   wherein the fourth sample is a sample nearest to the first sample in a group of samples subsequent to the first sample and having signal values not corresponding to the clipping level,
   wherein the fifth sample is a sample immediately subsequent to the fourth sample, and
   wherein the interpolating unit obtains the estimated signal value using a linear interpolation using at least one of (1) a straight line that passes through the second sample and the third sample and (2) a straight line that passes through the fourth sample and the fifth sample.

4. The apparatus according to claim 3, wherein the interpolating unit multiplies the estimated signal value obtained by the linear interpolation with a predetermined coefficient and rewrites the signal value of the first sample into the multiplied estimated signal value.

5. The apparatus according to claim 1, wherein the interpolating unit performs a process for removing a high frequency component over the first sample using the estimated signal value and samples previous to and subsequent to the first sample, when an absolute value of at least one of (1) a difference between the first sample and the sample immediately previous to the first sample and (2) a difference between the first sample and the sample immediately subsequent to the first sample is not within a predetermined range.

6. The apparatus according to claim 1, wherein the interpolating unit performs a process for removing a high frequency component over the first sample using the estimated signal value and samples previous to and subsequent to the first sample, when an absolute value of a difference between (1) a difference between the first sample and the sample immediately previous to the first sample and (2) a difference between the first sample and the sample immediately subsequent to the first sample is not within a predetermined range.

7. The apparatus according to claim 1, wherein the interpolating unit performs a process for removing a high frequency component over the first sample using the estimated signal value and samples previous to and subsequent to the first sample, when a sign of a first second difference is different from a sign of a second second difference,
wherein the first second difference is a difference between (1) a difference between the first sample and the sample immediately subsequent to the first sample and (2) a difference between the sample immediately subsequent to the first sample and the sample secondly subsequent to the first sample, and
wherein the second second difference is a difference between (3) a difference between the first sample and the sample immediately previous to the first sample and (4) a difference between the first sample and the sample immediately subsequent to the first sample.

8. The apparatus according to claim 1, wherein the interpolating unit obtains the estimated signal value by a polynomial interpolation using at least three samples including the second sample and the fourth sample.

9. The apparatus according to claim 1, wherein the analog-digital converting unit performs the conversion into the digital output signal at an n times oversampling rate with respect to a frequency of the analog input signal, where n is an integer equal to or larger than two, and
wherein the interpolating unit obtains the estimated signal value by performing a convolution process of (1) every n samples including no sample having the clipping level and acquired from each of sample groups that are previous to and subsequent to the first sample with (2) an SINC function corresponding to an inverse Fourier transform of a bandwidth of the analog input signal, when the number of consecutive samples having the clipping level including the first sample is equal to or smaller than (n−1).

10. The apparatus according to claim 1, wherein the analog-digital converting unit performs the conversion into the digital output signal at an n times oversampling rate with respect to a frequency of the analog input signal, where n is an integer equal to or larger than two, and wherein the interpolating unit operates to:
calculate an alternative value for a signal value of a sample having the clipping level included in every n samples acquired from each of the sample groups that are previous to and subsequent to the first sample by utilizing an interpolation using a sample having no clipping level; and
obtain the estimated signal value by performing a first convolution process of (1) the alternative value and (2) any of the every n samples having no clipping level with (3) an SINC function corresponding to an inverse Fourier transform of a bandwidth of the analog input signal.

11. The apparatus according to claim 10, wherein the interpolating unit further operates to:
perform, after obtaining the estimated signal value, a second convolution process of (1) the estimated signal value and (2) other samples stored in the buffer unit with (3) an SINC function corresponding to an inverse Fourier transform of a bandwidth of the analog input signal; and
rewrite the signal value of the first sample stored in the buffer unit into the value obtained by the second convolution process.

12. A radio communication terminal comprising:
a RF unit that down-converts a radio wave into an analog input signal;
an analog-digital converting unit that converts the analog input signal into a digital output signal;
a buffer unit that temporary stores the digital output signal for a plurality of samples and outputs the samples in time-series;
a clipping detecting unit that detects a first sample having a signal value corresponding to a clipping level of the analog-digital converting unit from among the samples of the digital output signal;
an interpolating unit that rewrites the signal value of the first sample stored in the buffer unit into an estimated signal value that is obtained by estimating a signal value at a time corresponding to a time of the first sample by an interpolation using at least one of (1) a set of second and third samples that are samples previous to the first sample and (2) a set of fourth and fifth samples that are samples subsequent to the first sample;
a carrier sensing unit that analyzes the signal value rewritten by the interpolating unit; and
a data transmitting unit that stops data transmission in a frequency band when another signal is detected in the frequency band due to the analysis by the carrier sensing unit and performs data transmission in the frequency band when no other signal is detected in the frequency band.

13. A computer readable storage medium that stores a program product for causing a computer, which controls an analog-digital converting apparatus having: an analog-digital converting unit that converts an analog input signal into a digital output signal; and a buffer unit temporarily stores the digital output signal for a plurality of samples and outputs the samples in time-series, to perform a process comprising:
detecting a first sample having a signal value corresponding to a clipping level of the analog-digital converting unit from among the samples of the digital output signal; and
rewriting the signal value of the first sample stored in the buffer unit into an estimated signal value that is obtained by estimating a signal value at a time corresponding to a time of the first sample by an interpolation using at least one of (1) a set of second and third samples that are sample previous to the first sample and (2) a set of fourth and fifth samples that are samples subsequent to the first sample;
measuring a frequency at which a sample having a signal value corresponding to the clipping level of the analog-digital converting unit is detected; and
changing an amplitude of the analog input signal corresponding to the measured frequency.

* * * * *